ized Patent

(12) United States Patent
Hatsuda

(10) Patent No.: US 10,410,733 B2
(45) Date of Patent: Sep. 10, 2019

(54) MEMORY DEVICE AND CONTROLLING METHOD THEREOF

(71) Applicant: TOSHIBA MEMORY CORPORATION, Minato-ku, Tokyo (JP)

(72) Inventor: Kosuke Hatsuda, Tokyo (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 76 days.

(21) Appl. No.: 15/699,812

(22) Filed: Sep. 8, 2017

(65) Prior Publication Data
US 2017/0372791 A1  Dec. 28, 2017

Related U.S. Application Data

(63) Continuation of application No. PCT/JP2016/055961, filed on Feb. 23, 2016.
(Continued)

(51) Int. Cl.
G11C 17/18 (2006.01)
G11C 29/36 (2006.01)
(Continued)

(52) U.S. Cl.
CPC ............ *G11C 17/18* (2013.01); *G11C 11/401* (2013.01); *G11C 17/165* (2013.01);
(Continued)

(58) Field of Classification Search
CPC ....... G11C 17/18; G11C 29/787; G11C 29/36; G11C 11/401; G11C 29/027; G11C 17/165; G11C 29/18
See application file for complete search history.

(56) References Cited

U.S. PATENT DOCUMENTS 6,542,420 B2  4/2003 Takase
6,947,318 B1  9/2005 Fujita
(Continued)

FOREIGN PATENT DOCUMENTS

JP  11120788 A  4/1999
JP  2004118921 A  4/2004
(Continued)

OTHER PUBLICATIONS

International Search Report (ISR) and Written Opinion dated Mar. 29, 2016 issued in International Application No. PCT/JP2016/055961.

*Primary Examiner* — Tri M Hoang
(74) *Attorney, Agent, or Firm* — Holtz, Holtz & Volek PC

(57) ABSTRACT

According to one embodiment, a memory device includes: a memory cell array including a first and a second array; a fuse circuit to hold first data; and a control circuit to control a replacement process on the first and second arrays based on the first data. When a first address in a first direction in the first array is supplied, the fuse circuit transfers the first data corresponding to the first address to the control circuit, and when a second address in a second direction in the first array is supplied after the first data is transferred, the control circuit accesses one of the first and second arrays based on a comparison result for the second address and the first data.

20 Claims, 16 Drawing Sheets

Related U.S. Application Data

(60) Provisional application No. 62/131,091, filed on Mar. 10, 2015.

(51) Int. Cl.
| | | |
|---|---|---|
| *G11C 29/18* | (2006.01) | |
| *G11C 29/02* | (2006.01) | |
| *G11C 17/16* | (2006.01) | |
| *G11C 29/00* | (2006.01) | |
| *G11C 11/401* | (2006.01) | |
| *G11C 11/16* | (2006.01) | |
| *G11C 29/44* | (2006.01) | |

(52) U.S. Cl.
CPC ............ *G11C 29/027* (2013.01); *G11C 29/18* (2013.01); *G11C 29/36* (2013.01); *G11C 29/785* (2013.01); *G11C 29/787* (2013.01); *G11C 11/16* (2013.01); *G11C 2029/4402* (2013.01)

(56) References Cited

U.S. PATENT DOCUMENTS

| | | |
|---|---|---|
| 2005/0141305 A1 | 6/2005 | Zhu et al. |
| 2010/0220517 A1 | 9/2010 | Okayama |
| 2012/0320656 A1 | 12/2012 | Chung |
| 2013/0051160 A1 | 2/2013 | Sawada |
| 2013/0173864 A1 | 7/2013 | Kajigaya |
| 2013/0223170 A1* | 8/2013 | Kajigaya ................ G11O 29/80 365/200 |
| 2015/0003141 A1* | 1/2015 | Son ...................... G11O 29/846 365/96 |
| 2015/0043288 A1* | 2/2015 | Kim ...................... G11O 17/14 365/189.05 |

FOREIGN PATENT DOCUMENTS

| | | |
|---|---|---|
| JP | 2010225259 A | 10/2010 |
| JP | 2012022769 A | 2/2012 |

\* cited by examiner

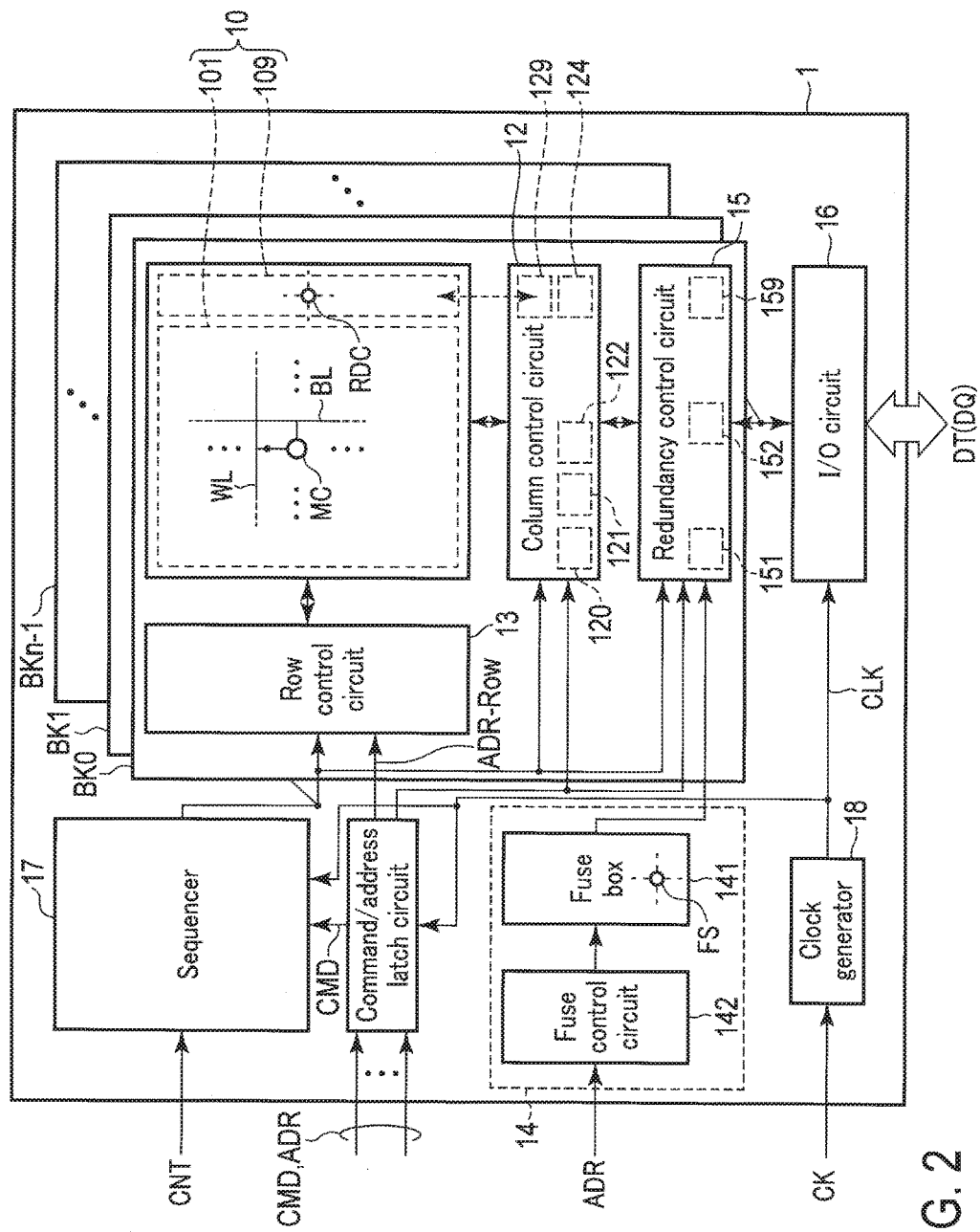
F I G. 2

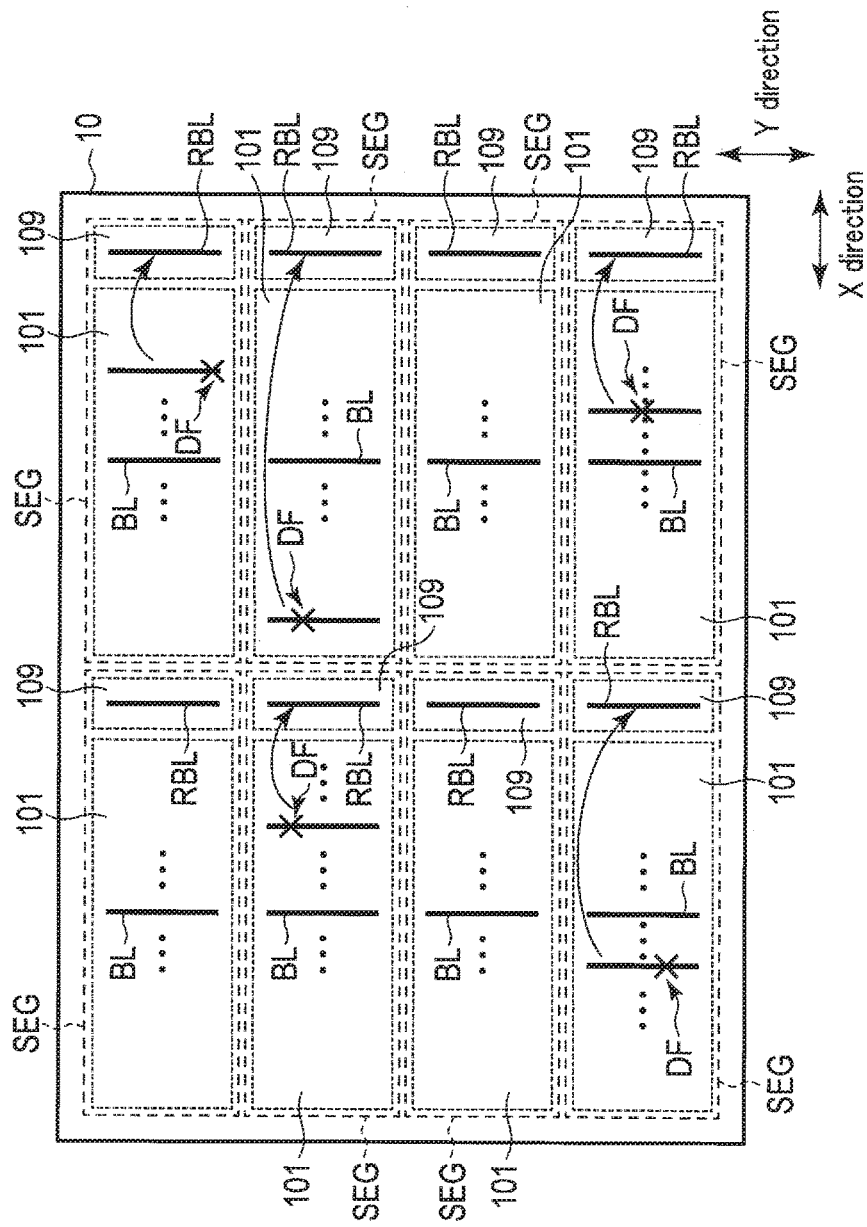
F I G. 3

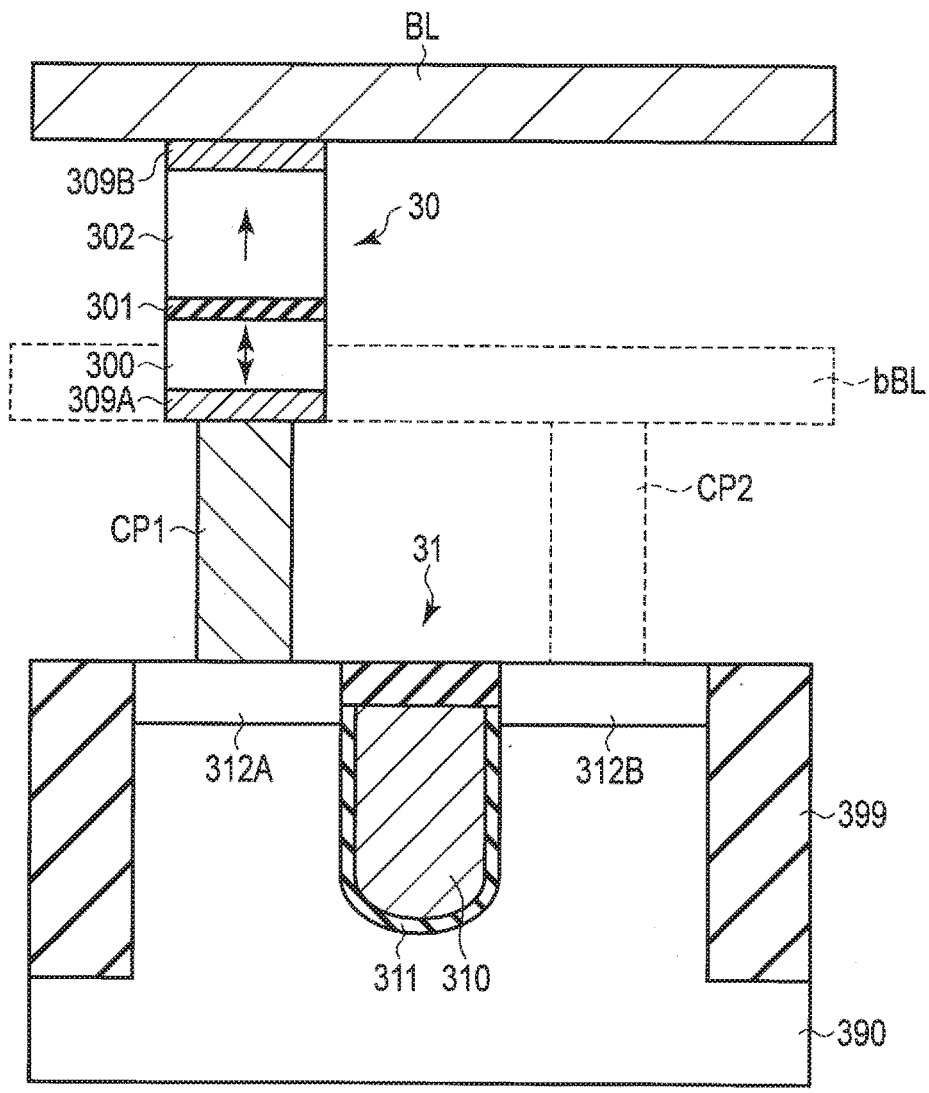
F I G. 5

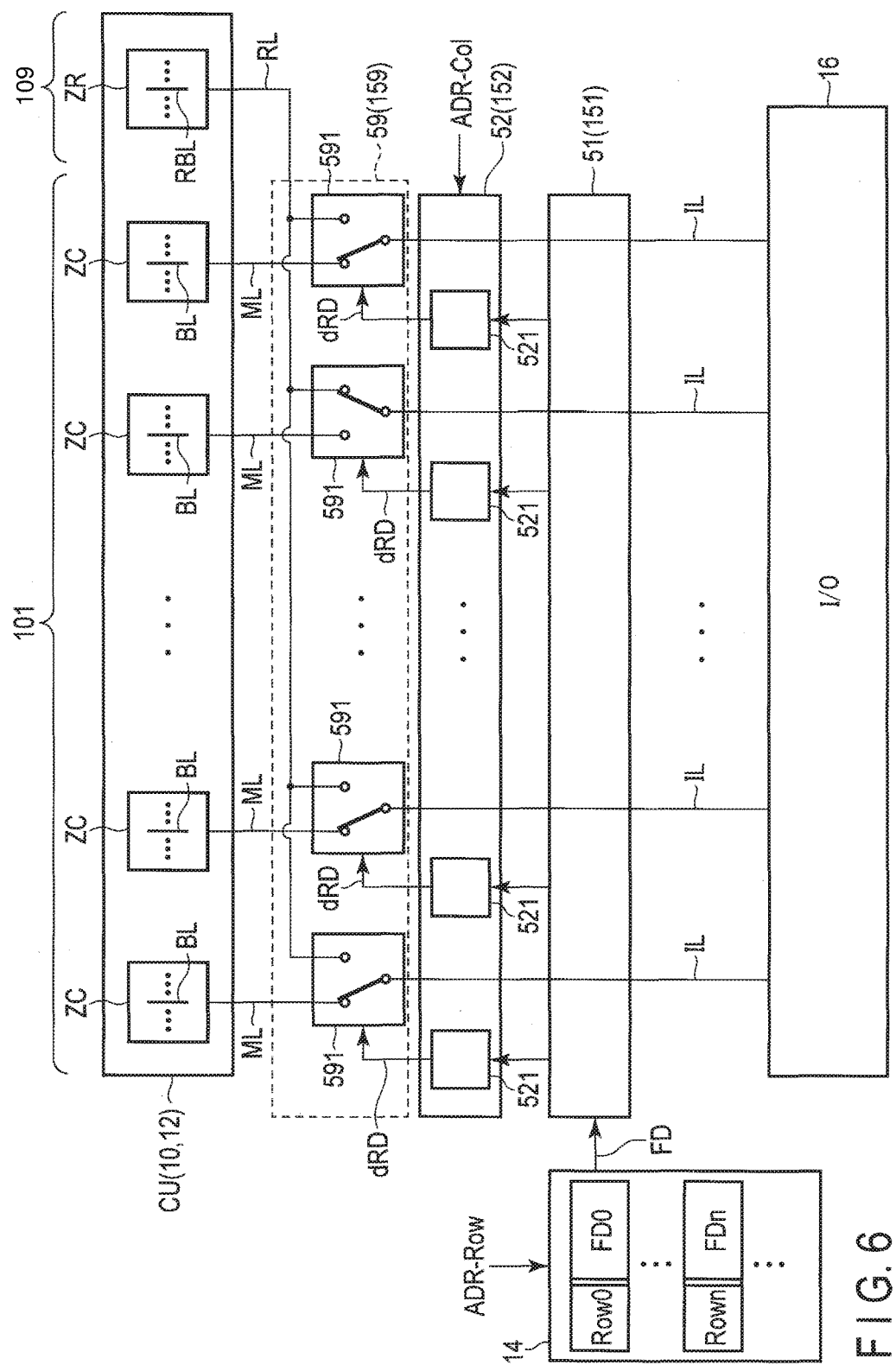
F I G. 6

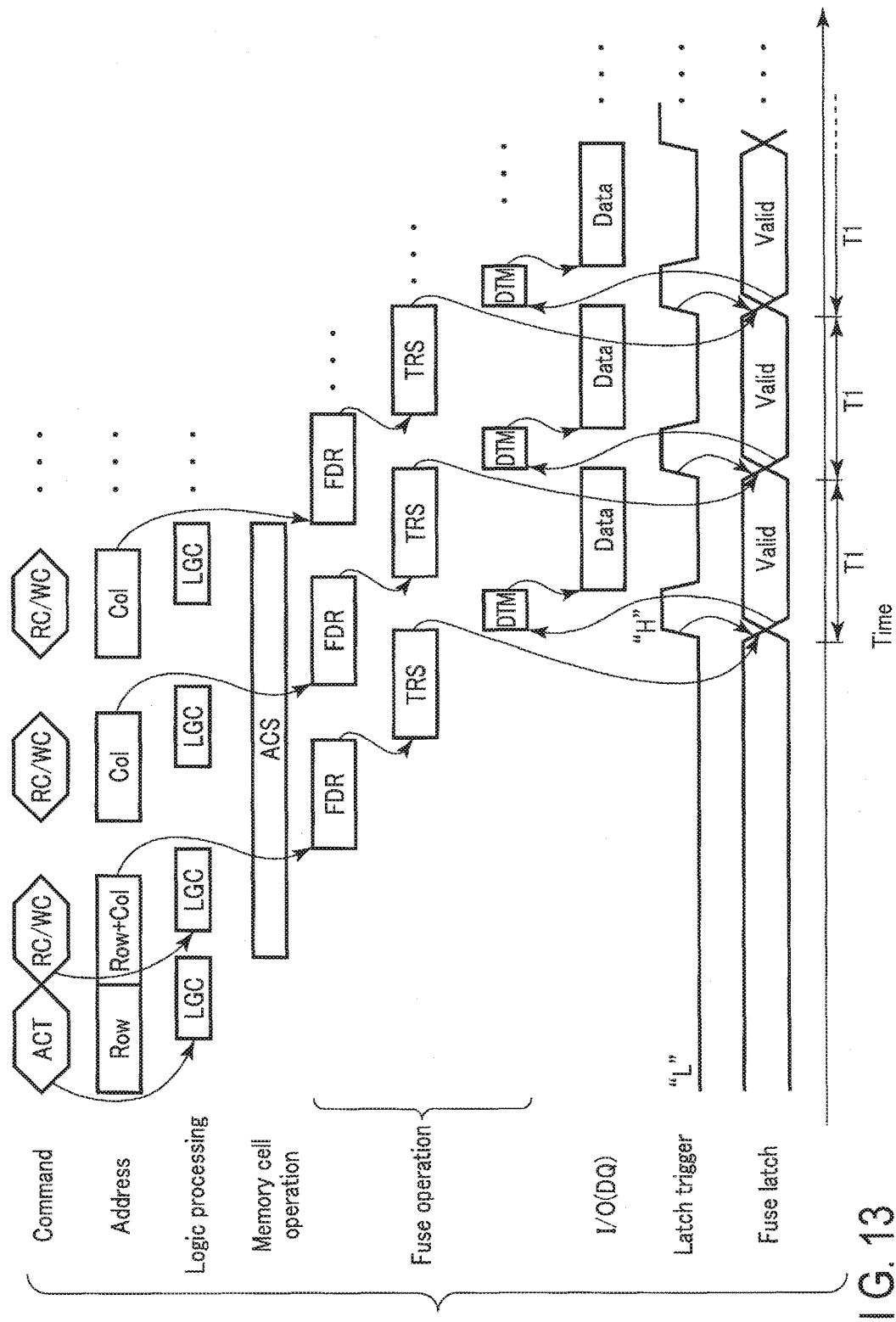
F I G. 13

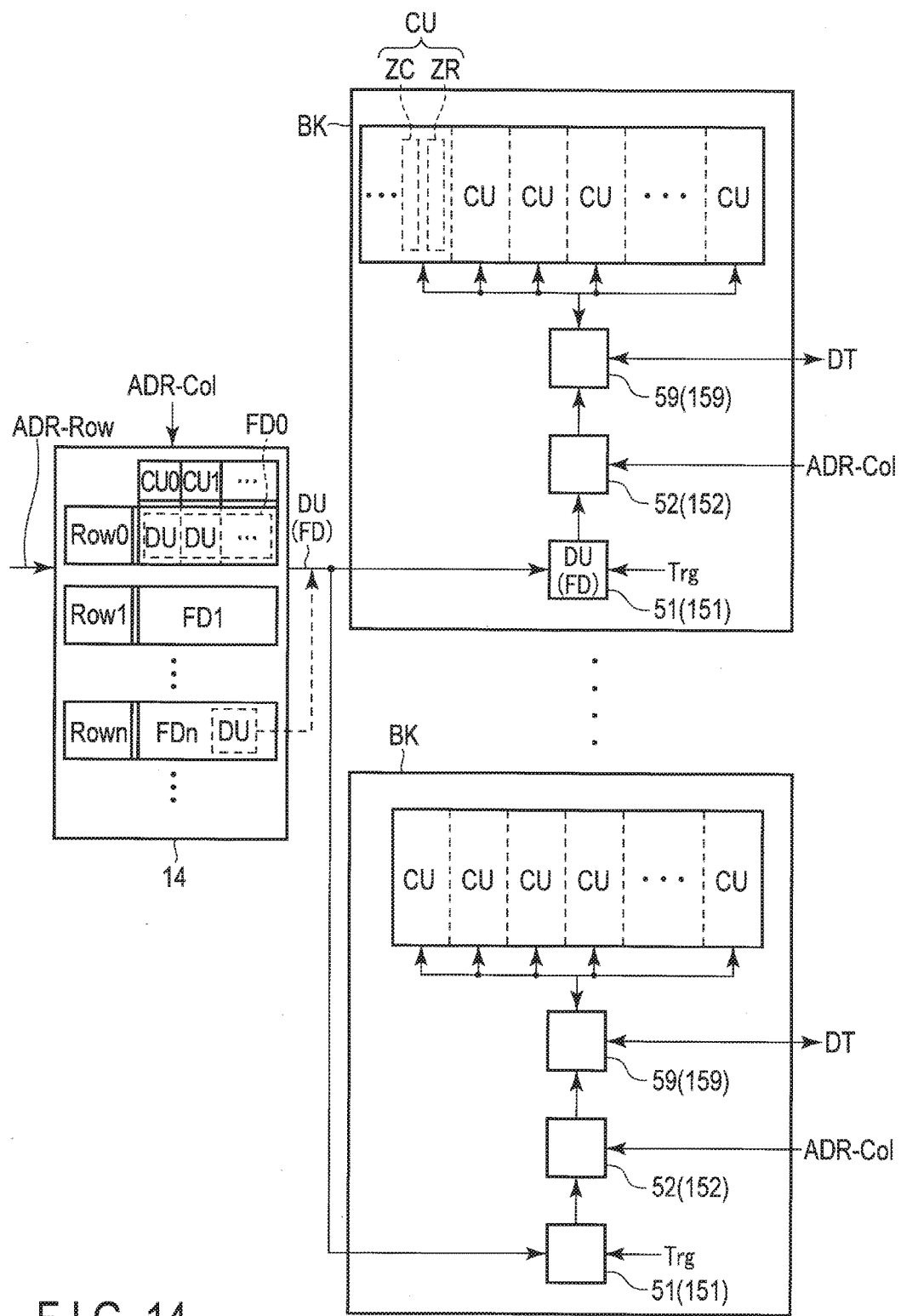
F I G. 14

MEMORY DEVICE AND CONTROLLING METHOD THEREOF

CROSS-REFERENCE TO RELATED APPLICATIONS

This application is a Continuation Application of PCT Application No. PCT/JP2016/055961, filed Feb. 23, 2016 and based upon and claiming the benefit of priority from U.S. Provisional Application No. 62/131,091, filed Mar. 10, 2015, the entire contents of all of which are incorporated herein by reference.

FIELD

Embodiments described herein relate generally to a memory device and a controlling method thereof.

BACKGROUND

In recent years, development of memories utilizing changes in the resistance values of elements (resistance change type memory) has been promoted, such as a magnetic memory (MRAM), a resistance change memory (ReRAM), and a phase change memory (PCRAM).

BRIEF DESCRIPTION OF THE DRAWINGS

FIG. 2 is a diagram depicting an example of an internal configuration of a memory device in a first embodiment;

FIG. 3 is a diagram depicting a configuration example of a memory cell array in the memory device in the first embodiment;

FIG. 5 is a diagram depicting a structure example of a memory cell in the memory device in the first embodiment;

FIG. 6 is a diagram depicting an example of an internal configuration of the memory device in the first embodiment;

FIG. 13 is a timing chart illustrating an operation example of the memory device in the third embodiment;

FIG. 14 is a diagram illustrating a modification of the memory device in the third embodiment;

DETAILED DESCRIPTION

Figure 1:
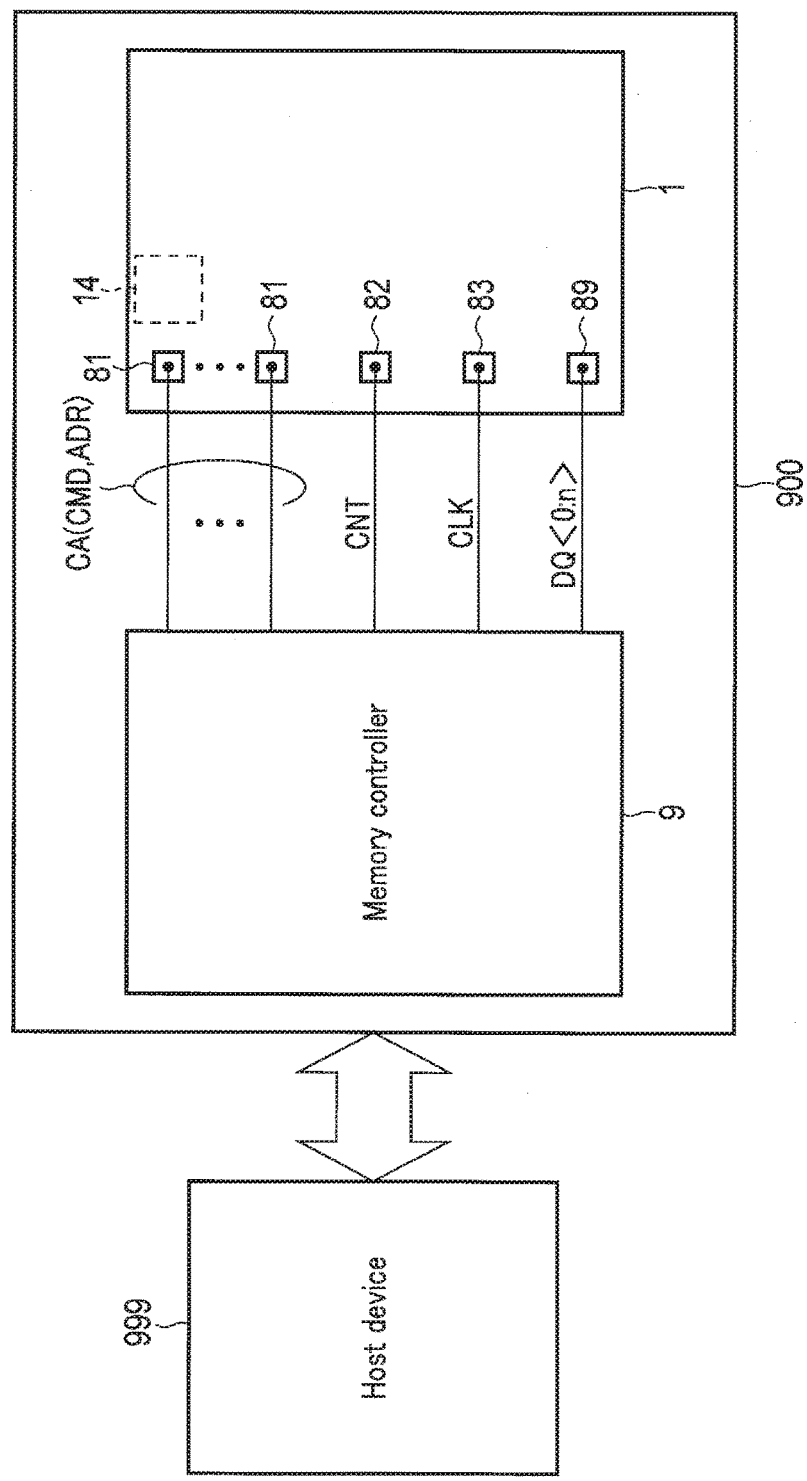
FIG. 1 is a schematic diagram depicting a general configuration of a system including a memory device in embodiments.

In general, according to one embodiment, a memory device includes a memory cell array including a first array and a second array; a fuse circuit configured to hold at least one piece of first data, the first data indicating a defect address in the first array; and a control circuit configured to control a replacement process on the first and second arrays based on the first data. When a first address in a first direction in the first array is supplied, the fuse circuit transfers the first data corresponding to the first address to the control circuit, and when a second address in a second direction in the first array is supplied after the first data is transferred to the control circuit, the control circuit accesses one of the first and second arrays based on a comparison result for the second address and the first data.

Embodiments

Memory devices in embodiments will be described with reference to FIGS. 1 to 16.

Elements with the same functions and configurations are hereinafter denoted by the same reference numerals, and duplicate descriptions will be given as needed.

(1) First Embodiment

With reference to FIGS. 1 to 9, a memory device and a controlling method thereof will be described.

(a) Configuration Example

FIG. 1 is a diagram depicting a general configuration of a memory system including a memory device in the first embodiment.

A storage device 900 is coupled to a host device 999. The storage device 900 and the host device 999 transfer data using, for example, connectors, wireless communication, or the Internet.

The host device 999 requests the storage device 900 to perform data writing/erasure or data reading.

The storage device 900 includes a memory device (for example, a resistance change type memory) 1 in the present embodiment and a memory controller 9.

The resistance change type memory 1 in the present embodiment is coupled to the memory controller 9. Various signals are transmitted and received between the resistance change type memory 1 and the memory controller 9.

The memory controller 9 issues a command indicative of a request to the resistance change type memory 1 for an operation. The command CMD is, for example, a signal commanding activation of an interconnect or a signal commanding data reading or data writing.

The memory controller 9 supplies the resistance change type memory 1 with an address ADR indicative of a target for the operation.

The memory controller 9 supplies the resistance change type memory 1 with a control signal CNT that allows control of the operation of the resistance change type memory 1 along with the command CMD and the address ADR. The control signal CNT includes, for example, a clock enable signal, a chip select signal, or a data strobe signal and the like.

The memory controller 9 supplies the resistance change type memory 1 with an external clock CK that allows control of an operational timing for the resistance change type memory 1.

Data DT is transferred between the memory controller 9 and the resistance change type memory 1 in accordance with the operation indicated by the command CMD.

The resistance change type memory 1 performs the operation requested by the host device 999 based on the command CMD and the control signal CNT from the memory controller 9.

The resistance change type memory 1 includes a plurality of external connection terminals 81, 82, 83, 89 through which signals are transmitted and received. The external connection terminals 81 to 83, 89 are, for example, pads. The external connection terminals 81 to 83, 89 may be pins or ball grids.

The pads 81 to 83, 89 are used as a part of an interface that allows the resistance change type memory 1 to connect to the controller 9. The pads 81 to 83, 89 are connected to a plurality of command/address lines CA, a plurality of data lines DQ<0:n>, or the like, respectively, in accordance with functions assigned to the pads. The command address lines CA are used to transmit and receive the command. CMD and the address ADR. The data lines (hereinafter referred to as the DQ lines) DQ<0:n> are used to transmit and receive data. A control signal line is used to supply the control signal CNT. A clock signal line is used to supply a clock signal.

A plurality of pads (hereinafter referred to as CA pads) 81 that allow transmission and reception of the command CMD and the address ADR are connected to the command/address lines CA.

A plurality of pads (hereinafter referred to as DQ pads) 89 that allow transmission and reception of data are connected to the DQ lines DQ<0:n>.

A pad 82 that allows transmission and reception of the control signal is connected to the control signal line. A pad 83 that allows reception of the external clock is connected to the clock signal line.

For example, the number of the various pads provided in the resistance change type memory 1 is defined based on specifications for the memory.

FIG. 2 is a diagram depicting a configuration example of the resistance change type memory in the present embodiment.

The resistance change type memory 1 includes a plurality of banks BK (BK0, BK1, BKn−1).

Each of the banks BK includes a memory cell array 10, a column control circuit 12, and a row control circuit 13.

The memory cell array 10 includes a plurality of memory cells MC. The memory cells are connected to word lines WL and bit lines BL.

The memory cell array 10 includes a redundancy area 109.

If a defective memory cell or a defective bit line is present in an area 101 in the memory cell array 10, memory cells RDC in the redundancy area 109 are used instead of the defective memory cell and the memory cell connected to the defective bit line.

For clarity of description, an area 101 other than the redundancy area 109 in the memory cell array 10 is hereinafter referred to as a main area 101. The main area 101 is mainly used as a storage area for external data. Furthermore, for clarity of description, the memory cells in the redundancy area 109 are hereinafter referred to as redundancy cells RDC.

The column control circuit 12 controls columns in the memory cell array 10.

The column control circuit 12 includes a column decoder 120, a write circuit 121, and a read circuit 122.

The column decoder (column switch circuit) 120 is a circuit that allows selection from the bit lines BL. The write circuit 121 is a circuit that allows data to be written to the memory cell MC. The write circuit 121 includes a source/sink circuit that allows a write current or a write voltage to be generated. The read circuit 122 is a circuit that allows data to be read from the memory cell MC. The read circuit 122 includes a sense amplifier. For example, the column control circuit 12 includes a latch circuit 124 that temporarily holds data from the memory cell.

The column control circuit 12 includes a circuit (hereinafter referred to as a redundancy circuit) 129 with the sense amplifier and a column switch which is provided for redundancy cells RDC. The redundancy cells RDC and the redundancy circuit 129 are treated as one set (module) for defect replacement.

The row control circuit 13 controls rows in the memory cell array 10. The row control circuit 13 includes a row decoder (word line driver) that allows selection from the word lines WL.

The fuse circuit 14 has a defect address in the memory cell array 10 (the address of a unit including the defective memory cell/bit line) and information for redundancy control.

The fuse circuit 14 includes a fuse box (fuse array) 141 and a fuse control circuit 142.

The fuse box 141 stores at least one defect address in the memory cell array 10. The defect address is written into the fuse box 141 based on test results for the resistance change type memory 1.

The fuse box 141 includes a plurality of fuse elements FS. The fuse elements FS are arranged in an array in the fuse box 141. One fuse element FS stores 1-bit data. Disconnection or non-disconnection of each of the fuse elements FS is set depending on a defect address to be stored.

For example, a unit of a plurality of fuse elements FS (fuse unit) is set in the fuse box 141. One fuse unit has a storage capacity that enables a defect address corresponding to one relief unit to be stored.

For example, the fuse element is an electrically programmable fuse element (which is hereinafter an e-fuse element). However, the fuse element may be a fuse element that can be programmed by a laser (laser blow fuse element.)

The area of the e-fuse element is smaller than the area of the laser blow fuse element. Thus, in a certain unit area, the number of e-fuse elements can be set larger than the number of laser fuse elements. When the e-fuse element is used, the fuse box 141 has an increased storage density, resulting in an improved relief rate of defects in the memory cell array 10.

Data on defect addresses in the fuse box 141 is hereinafter referred to as redundancy data (or fuse data or defect address data). A unit of a plurality of redundancy data FD (FD0 to FDn) is referred to as redundancy information (or defect address information). n is a natural number of at least 0.

For example, each piece of redundancy data FD is associated with a row address in the memory cell array 10. Hence, one piece of redundancy data FD can be read based on the row address. Furthermore, each piece of redundancy data FD includes the address of a defective portion concerning the columns in the memory cell array. The redundancy data FD includes a plurality of data units corresponding to a control unit with a certain size set for the columns in the memory cell array. Such redundancy data is hereinafter also referred to as column redundancy data.

The fuse control circuit 142 controls reading of the redundancy data in the fuse box 141 and transfer of the read data. When redundancy data is written to the fuse box 141 (the fuse is blown), the fuse control circuit 142 controls selection of write target fuse elements, application of voltages to the fuse elements, and the like.

The fuse control circuit 142 receives the address ADR from the memory controller 9. The fuse control circuit 142 can, for example, analyze the address ADR.

For example, as depicted in FIG. 1, the fuse circuit 14 (particularly the fuse elements) is collectively provided near an area where the pads are arranged.

A redundancy control circuit 15 uses the redundancy information. (defect addresses) from the fuse circuit 14 to control an operation performed on the redundancy area 109. For example, the redundancy control circuit 15 is provided in each bank BK. The redundancy control circuit 15 is provided, for example, between the column control circuit 12 and an I/O circuit 15.

The redundancy control circuit 15 includes a latch circuit 151, a determination circuit 152, and a switch circuit 159.

The latch circuit 151 temporarily holds the redundancy data FD transferred from the fuse circuit 14. For clarification of description, the latch circuit 151 is hereinafter referred to as the fuse latch circuit 151.

The determination circuit 152 compares the redundancy data FD in the fuse latch circuit 151 with an external address (for example, a column address) to determine whether or not to replace a control unit in the main area with a control unit in the redundancy area. For clarification of description, the determination circuit 152 is hereinafter referred to as the replacement determination circuit 152.

A switch circuit 159 connects the I/O circuit 16 to one of the control units in the main area and in the redundancy area based on a determination result from the replacement determination circuit. For clarification of description, the switch circuit 159 is hereinafter referred to as the replacement switch circuit 159.

The I/O circuit 16 temporarily holds data from the memory cell array 10 and data from the memory controller 9. The I/O circuit 16 receives the data from the memory cell array 10 through the column control circuit 12 and the redundancy control circuit 15. The I/O circuit 16 receives the data from the memory controller 9 through the DQ line and the DQ pad.

A command/address latch circuit 17 temporarily holds the command CMD and the address ADR supplied to the CA pad 81, and at a certain timing, transfers the command CMD and the address ADR to each circuit in the memory 1. The command/address latch circuit 17 outputs the command CMD to a sequencer 19. The command/address latch circuit 17 outputs the address ADR (ADR-Row, ADR-Col) to the row control circuit 13, the column control circuit 12, and the fuse control circuit 142. The address ADR of the pad 81 may be supplied directly to the fuse control circuit 142.

A clock generation circuit 18 generates an internal clock CLK for the interior of the resistance change type memory 1 based on an external clock CK.

The sequencer 19 controls the operation of the whole interior of the resistance change type memory 1 based on the command CMD and control signal CNT from the memory controller 9.

An internal configuration of the memory cell array in the resistance change type memory in the present embodiment will be described with reference to FIGS. 3 to 5.

As depicted in FIG. 3, the memory cell array 10 includes a plurality of control areas SEG. The control areas SEG are hereinafter referred to as the segments SEG.

FIG. 3 is a diagram schematically depicting the internal configuration of the memory cell array.

The segment SEG is an area resulting from logical division. The segment SEG is an area indicated by a row address of several bits and a column address of several bits.

For simplification of description, FIG. 3 illustrates an example where eight segments SEG are provided in the memory cell array 10. In this case, the memory cell array 10 is divided into two logical areas (control units) in an X direction and four logical areas (control units) in a Y direction in order to set segments SEG.

The segment SEG includes a main area 101. For example, the redundancy area 109 is provided in each segment SEG. When a column redundancy configuration is applied to the memory cell array 10, the redundancy area 109 is provided in the segment SEG adjacent to the main area 101 in the X direction.

Figure 4:
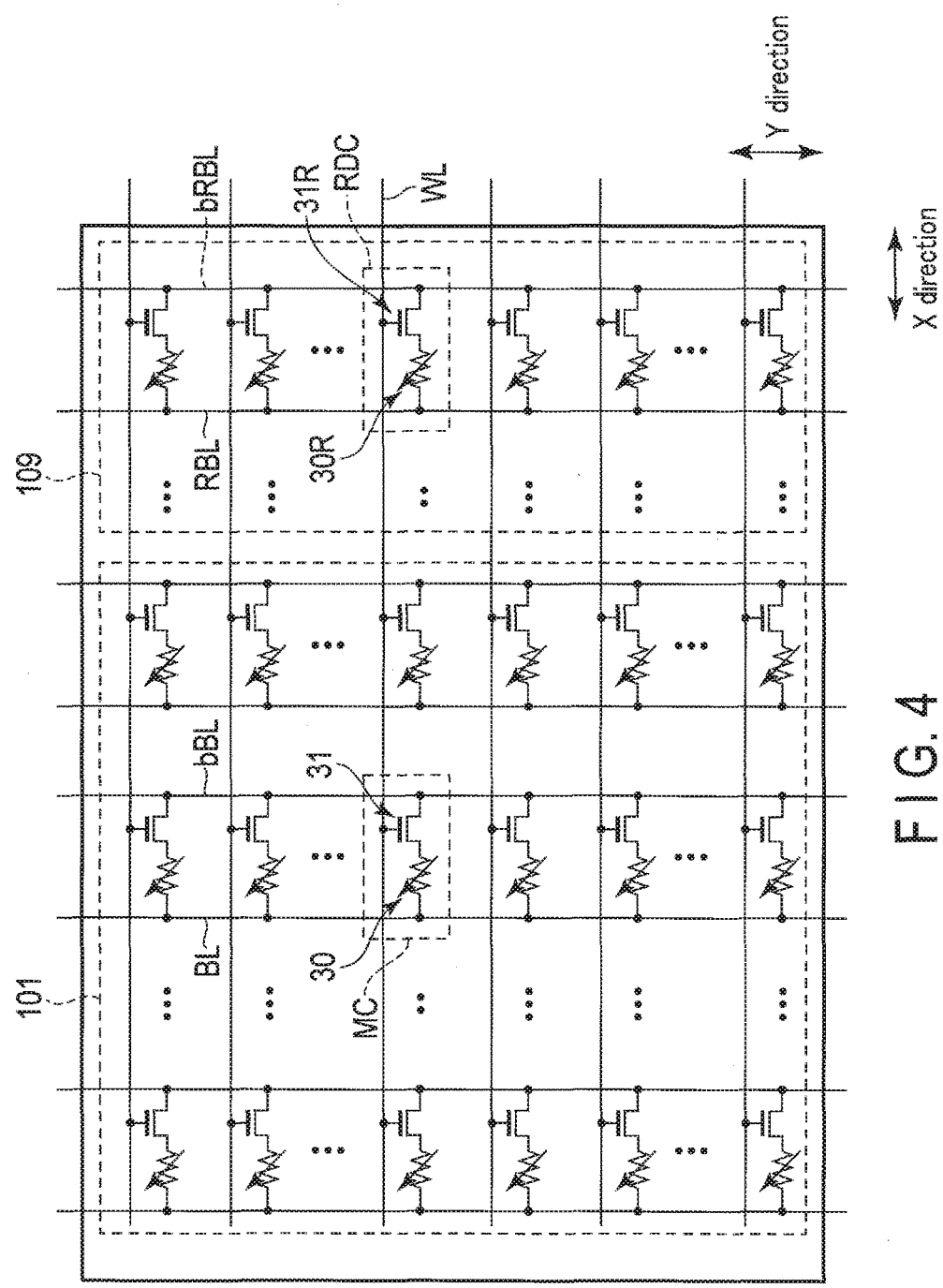
FIG. 4 is a diagram depicting the configuration example of the memory cell array in the memory device in the first embodiment.

FIG. 4 is a diagram depicting an example of a circuit configuration of the memory cell array in the resistance change type memory in the present embodiment. FIG. 4 illustrates the internal configuration of the memory cell array by extracting a part of the interior of the memory cell array.

As depicted in FIG. 4, in the main area 101 in the memory cell array 10, a plurality of memory cells MC are arranged along the X direction and the Y direction.

The plurality of memory cells MC arranged in the X direction are connected to the common word line WL.

The plurality of memory cells MC arranged in the Y direction are connected to the common bit lines BL and bBL.

One word line WL and two bit lines BL and bBL of a bit line pair are connected to each of the memory cells MC.

The memory cell MC includes one memory element 30 and one select element 31.

The memory element 30 is a resistance change element. The resistance change element 30 as a memory element may take a plurality of resistance values. Associating a certain resistance value with data allows the resistance change element 30 to hold the data to be stored.

The select element 31 is a field effect transistor (hereinafter referred to as a cell transistor). The cell transistor 31 is turned on to enable data input and output to and from the memory cell MC.

For example, one end of the resistance change element 30 is connected to the bit line BL, and the other end of the resistance change element 30 is connected to one end of a current path (source/drain) in the cell transistor 31. The other end of the current path in the cell transistor 31 is connected to the bit line bBL. The word line WI is connected to a gate of the cell transistor 31.

An H level voltage (an on voltage for the cell transistor) is applied to the word line WL to select the memory cells MC. Depending on the operation performed on the memory cell MC, one of the two bit lines BL, bBL of the bit line pair is set to a high potential, whereas the other bit line is set to a low potential.

A plurality of the redundancy cells RDC is arranged in the redundancy area 109. The redundancy cell RDC is connected to one word line WL and two bit lines RBL, bBL of the bit line pair. For clarification of description, the bit lines RBL, bRBL to which the redundancy cell RDC is connected are referred to as redundancy bit lines RBL, bRBL.

The redundancy cell RDC arranged on the same straight line on which the memory cell MC is arranged in the X direction is connected to the word line WL common to the memory cell MC. A plurality of the redundancy cells RDC arranged in the Y direction are connected to common redundancy bit lines RBL, bRBL.

The redundancy cell RDC includes one resistance change element (memory element) 30 and a cell transistor (select element) 31 similarly to the memory cell MC.

For example, the elements 30, 31 of the redundancy cell RDC are connected to the redundancy bit lines RBL, bRBL and the word line WL, substantially as is the case with the connection relations between the memory cell MC and the bit lines/word line.

The redundancy cell RDC connected to the same word line WL as that to which the selected cell is connected is turned on at the same time as that when the selected cell is turned on. Depending on the operation performed on the redundancy cell RDC, one of the two redundancy bit lines RBL, bRBL connected to the redundancy cell RDC is set to a high potential, whereas the other redundancy bit line is set to a low potential.

The internal configuration of the memory cell array 10 may be a cross point type memory cell array. In the cross point type memory cell array, one end of the memory cell is connected to the bit line, and the other end of the memory cell is connected to the word line.

FIG. 5 is a diagram depicting a structure example of the memory cell in the resistance change type memory in the present embodiment.

As depicted in FIG. 5, when the resistance change type memory is an STT (Spin Transfer Torque)—MRAM, the memory cell includes a magnetoresistive element 30 as a memory element.

The magnetoresistive element 30 used for the MRAM is an element with a magnetic tunnel junction (MTJ). The magnetoresistive element 30 is hereinafter referred to as the MTJ element.

The MTJ element 30 includes at least a storage layer 300, a reference layer 302, and a tunnel barrier layer 301. The tunnel barrier layer (for example, a magnesium oxide film) 301 is sandwiched between the storage layer 300 and the reference layer 302. A lower electrode 309A is provided under the MTJ element 30. An upper electrode 309B is provided over the MTJ element 30.

The storage layer 300 and the reference layer 302 are magnetic layers with perpendicular magnetic anisotropy. Magnetization (magnetization direction) in the storage layer 300 and the reference layer 302 is perpendicular to a layer surface (film surface). The direction of magnetization in the storage layer 300 is variable, and the direction of magnetization in the reference layer 302 is invariable (fixed state).

When the direction of the magnetization in the storage layer 300 is the same as the direction of the magnetization in the reference layer 302 (when the MTJ element is in a magnetization parallel orientation state), the MTJ element 30 has a first resistance state (first resistance value). When the direction of the magnetization in the storage layer 300 is different from the direction of the magnetization in the reference layer 302 (when the MTJ element is in a magnetization anti-parallel orientation state), the MTJ element 30 has a second resistance state (second resistance value). The resistance value of the MTJ element 30 in the first resistance state is smaller than the resistance value of the MTJ element 30 in the second resistance state.

The cell transistor 31 is a transistor with a buried gate structure.

The cell transistor 31 has two diffusion layers 312A, 312B as source/drain areas of the cell transistor 31. The two diffusion layers 312A, 312B are provided in a semiconductor area 390.

A gate electrode 310 is provided between the two diffusion layers 312A and 312B. The gate electrode 310 is buried in a groove in the semiconductor area 390. A gate insulating film 311 is provided between the gate electrode 310 and the semiconductor area 390. The gate electrode 310 extends in the h direction and function as the word line WL.

The upper electrode 309B of the MTJ element 30 is connected to the bit line BL via a via plug (not depicted in the drawings). The lower electrode 309A of the MTJ element 30 is connected to the diffusion layer 312A of the cell transistor 31 via a contact plug CP1. The diffusion layer 312B of the cell transistor 31 is connected to the bit line bBL via a contact plug CP2.

The redundancy cell RDC has the same structure as that of the memory cell MC.

When data is written into the memory cell MC, a write current is supplied to the MTJ element 30. The write current flows through the MTJ element 30 to change the direction of the magnetization of the storage layer 300. A change in the relative magnetization orientation between the storage layer 300 and the reference layer 302 in turn changes the resistance value of the MTJ element 30. As a result, data is written into the memory cell MC. Depending on the data to be written ("1" or "0"), the direction in which the write current flows between the storage layer 300 and the reference layer 302 is controlled by the write circuit 121.

Magnetic properties of the reference layer 302 are controlled so as to prevent the direction of the magnetization of the reference layer 302 from being changed by the write current when the write current is supplied to the MTJ element 30. This provides the reference layer 302 with an invariable magnetization direction.

Reading of data from the memory cell MC is performed by passing a read current through the MTJ element 30. The current value (or potential) of a read node varies in accordance with a resistance state of the MTJ element 30. A certain reference value and the current value of the read node are compared by the sense amplifier in the read circuit 122. As a result, the data stored in the MTJ element 30 is determined.

The current value of the read current is set to a magnitude that does not change the resistance state of the MTJ element 30.

The resistance change type memory 1 in the present embodiment may be a resistance memory (RERAM) or a phase change memory (PCRAM). Hence, the memory element 30 may be a transition metal oxide resistance change element (for example, an element with a nickel oxide film or a titanium oxide film) or a phase change element (for example, an element with a chalcogenide film).

Transfer of data to the memory cell having a configuration of FIGS. 3 to 5 is performed by selecting (activating) from the word lines and the bit lines based on the address.

A plurality of access units are set for the columns in the memory cell array 10 (or the segments SEG). The access units sec for the columns are hereinafter referred to as the column access units.

A plurality of access units are set for the rows in the memory cell array 10 (or the segments SEG). The access units set for the rows are hereinafter referred to as the row access units. The row access unit is referred to as, for example, a page and corresponds to a unit corresponding to one word line.

A memory cell in the main area 101 is selected as an access target using die row access unit and the column access unit based on an external address.

As depicted in FIG. 3, a defect DF may occur in the memory cell MC or a circuit connected to the bit line BL (for example, the sense amplifier). The unit of a column including a defective memory cell, a defective bit line, and a defective circuit is hereinafter referred to as a defective column.

The defective column DF may preclude access to the memory cell.

For relief of such a defective column DF, an inaccessible memory cell is replaced with the redundancy cell RDC. The redundancy cell RDC is selected as an access target alternative to the inaccessible memory cell MC. A set of the redundancy cell RDC, the redundancy bit lines, and the redundancy circuit is referred to ac a redundancy column. For clarification of description, a set of the memory cell MC, bit line, and column circuit on the main area 101 side is referred to as a main column. For example, the main column is a unit including at least one bit line.

In order to the replacement process for the defective memory cell and the redundancy cell RDC, a relief unit (a set of the number of bit lines) having a certain size is set in the memory cell array 10. In the memory cell array 10 in a column redundancy configuration, a plurality of relief units are set for the columns in the memory cell array 10. The relief units are control units set by logically separating the memory cell array 10 (segments SEG). For example, the unit of a column including at least one bit line BL (at least one redundancy bit line RBL) is a relief unit (defect replacement unit).

In the main area 101, when, for example, the column access unit CU includes a defect DF, a group of at least one bit line including the defect DF (main column) is replaced with a group (redundancy column) ZR of redundancy bit lines that are identical in number to the bit lines as a relief unit.

FIG. 3 illustrates an example where one redundancy bit line RBL replaces one bit line BL with a defect DF a relief unit for simplification of description.

As described above, a defective portion in the memory cell array 10 (main area 101) and the column control circuit is relieved by the redundancy element/circuit applied to the memory.

The number of relief units in the memory cell array (or segments, column access units) correlates with a percent defective in the memory cell array and the number of redundancy data in the resistance change type memory (the number of fuse elements). When the number of relief units is increased, a defect relief ratio is improved. However, the number of fuses increases substantially in proportion to the number of relief units.

A replacement process for a defective column and a redundancy column is executed by the redundancy control circuit 15.

FIG. 6 is a diagram depicting a configuration example of the redundancy control circuit in the resistance change type memory in the present embodiment. FIG. 6 is a schematic diagram illustrating an internal configuration of the redundancy control circuit 15 and correspondence relations between the memory cell array 10 (for example, the segments SEG) and the redundancy control circuit 15.

As described above, at least one column access unit CU is set for the memory cell array 10 (segment SEG) and the column control circuit (for example, the sense amplifier).

FIG. 6 illustrates one extracted column access unit CU.

A defective column in the column access unit CU is replaced with the relief unit (redundancy column) ZR in the redundancy area 109 by using a relief unit (main column) ZC in the column access unit CU.

The fuse latch circuit 151 includes a plurality of latch units 51. The latch units 51 are included in the fuse latch circuit 151 in association with the column access units CU. The latch unit 51 can hold data with a bit length indicative of the address of one column access unit.

The fuse latch circuit 151 retrieves the redundancy data FD corresponding to a selected row address from the fuse array 141. When the fuse latch circuit 151 retrieves the redundancy data, the redundancy data FD is set to a valid state in the redundancy control circuit 15.

For example, the latch unit 51 has e storage capacity of approximately 5 bits according to the size of a data unit (redundancy data in the memory cell array) in the column access unit CU.

The fuse latch circuit 151 may be able to hold the redundancy data FD for one row access unit. Hence, in the present embodiment, the storage capacity of the fuse latch circuit 151 is smaller than the storage capacity of the fuse box 141.

The replacement determination circuit 152 compares a supplied selected column address ADR-Col with the redundancy data FD in the fuse latch circuit 151. Based on a comparison result for the column address ADR-Col and the redundancy data FD, the determination circuit 152 determines whether or not to replace the main column (defective column) with the redundancy column.

The replacement determination circuit 152 includes a plurality of determination units 52.

The determination units 52 are provided in the replacement determination circuit 152 in association with the relief units (replacement units) in the column access unit CU. The number of the determination units 52 is the same as the number of the latch units 51. The determination unit 52 references the redundancy data FD in the latch circuit 51.

For example, the determination unit 52 includes a plurality of arithmetic circuits (logic circuits) 521 in association with the main side relief units ZC in the column access unit CU. This allows determination of whether to replace the defective column in the main area to be performed in relief units.

Depending on whether or not the selected column address ADR-Col matches the defect address in the redundancy data in each latch unit 51, the arithmetic circuit 521 controls the signal level of a control signal dRD.

When a certain arithmetic circuit 521 determines that selected column address ADR-Col matches the redundancy data FD, the arithmetic circuit 521 outputs a control signal at a first signal level (for example, an H level). The result of the determination that selected column address ADR-Col matches the redundancy data FD indicates that the main column corresponding to the selected column address is defective.

When the selected column address ADR-Col does not match the redundancy data FD in the latch unit 51, the arithmetic circuit 521 outputs a control signal dRD at a second signal level (for example, an L level). The result of the determination that selected column address ADR-Col does not match the redundancy data FD indicates that the main column corresponding to the selected column address is normal (not defective).

Based on the control signal dRD from the replacement determination circuit 152, the replacement switch circuit 159 connects the I/O circuit 16 to a main area 101-side interconnect (internal data line) IL or a redundancy area 109-side interconnect (redundancy data line) RL.

The replacement switch circuit 159 includes a plurality of switch units 59.

The switch units 59 are provided in the replacement switch circuit 159 in association with the column access units CU.

The number of switch units 59 is the same as the number of the determination units 52 and the number of the latch units 51.

The switch unit 59 includes a plurality of switches 591 in association with the main side relief units ZC in the column access unit CU.

Each of the switches 591 receives the control signal dRD from the arithmetic circuit 521.

The switch 591 controls the connection between the I/O circuit 16 and the redundancy column ZR (redundancy area 109) in accordance with the signal level corresponding to the replacement determination result.

When the control signal dRD at the first signal level (for example, the H level) is supplied to the switch 591, the switch 591 connects the redundancy data line RL to the I/O circuit 16.

When a defective column is present in the main area 101 as described above, the replacement process for the defective column and the redundancy column is executed. In the present example, when a part ZC in one column access unit CU includes a defect DF, the part ZC including the defect DF is replaced with the redundancy column ZR.

The replacement process allows data from the redundancy column ZR to be transferred to the I/O circuit 16 at the time of data reading. Alternatively, the data in the I/O circuit 16 is transferred to the redundancy column ZR at the time of data writing.

When the control signal dRD at the second signal level is supplied to the switch 591, the switch 591 connect the internal data line IL connected to the main column ZC to the I/O circuit 16. Thus, transfer of data between the main area 101 and the I/O circuit 16 is performed without execution of the replacement process.

As described above, the resistance change type memory 1 in the present embodiment uses the redundancy data FD and the redundancy control circuit 15 to enable transfer of data to the redundancy cell (redundancy column) instead of the defective cell (defective column). Thus, the resistance change type memory 1 in the present embodiment allows defects in the memory cell array 10 to be relieved.

In FIG. 6, for simplification and clarification of description, one internal data line IL is connected to each switch 591, and one redundancy data line RL is connected to a plurality of switch units 591. However, the number of data lines IL, RL connected to one switch 591 can be changed as needed according to the configuration of at least one of the column access unit and redundancy column (redundancy unit) set for the memory cell array 10. In connection with this, the number of switches 591 corresponding to one arithmetic circuit 521 can be changed as needed.

In an operational sequence for the resistance change type memory, a command allowing a word line (row) to be activated and the address of the word line (selected row address) are transmitted from the memory controller 9 to the resistance change type memory 1 via the CA pin 81 as a signal set.

After the resistance change type memory 1 receives the command and address for the control of the row, a signal set including a command indicative of an operation performed on the memory cell and the address of a bit line (selected column address) is transmitted from the memory controller 9 to the resistance change type memory 1 via the CA pin 81.

In this case, the resistance change type memory 1 performs control for the rows in the memory cell array based on the row address and then performs control for the columns in the memory cell array based on the column address.

In the resistance change type memory 1 in the present embodiment, the fuse circuit 14 outputs, to the redundancy control circuit 15, one piece of redundancy data (data indicative of a defect) FD among the plurality of redundancy data (redundancy information) in the fuse circuit 14 which corresponds to the address ADR provide from the external (for example, the memory controller). The one piece of redundancy data. FD to be output is selected based on the address ADR.

For example, the fuse control circuit 142 transfers, to the fuse latch circuit 151 in the redundancy control circuit 15, one piece of the redundancy data FD among the plurality of redundancy data stored in the fuse box 141 that is associated with all or a part of an external selected row address ADR-Row, based on the selected row address ADR-Row from the external.

The resistance change type memory 1 in the present embodiment transfers the redundancy data FD to the fuse latch circuit 151 within a period from reception of the command/row address CMD, ADR until processing on the rows in the memory cell array 10 (logic processing) is complete.

Thus, the resistance change type memory 1 in the present embodiment can perform redundancy control without reading all of the redundancy data in the fuse circuit 14 to the fuse latch circuit 151.

As a result, the resistance change type memory in the present embodiment enables a reduction in the circuit scale (the number of latch units) of the fuse latch circuit 151.

Furthermore, in the resistance change type memory in the present embodiment, the fuse latch circuit 151 may be able to store a data size according to the number of column access units assigned to the memory cell array (or segments). Hence, the resistance change type memory in the present embodiment allows the use of a fuse box with a high storage density in order to increase relief efficiency without an excessive increase in the circuit scale of the fuse latch circuit 151.

As described above, the resistance change type memory in the present embodiment enables an increase in relief efficiency and allows an increase in chip size to be suppressed.

(b) Operation Example

An operation example of the memory device (for example, a resistance change type memory) in the first embodiment will be described with reference to FIGS. 7 to 9. In this regard, the operation example of memory device in the present embodiment will be described using FIGS. 1 to 6, in addition to FIGS. 7 to 9.

Figure 7:
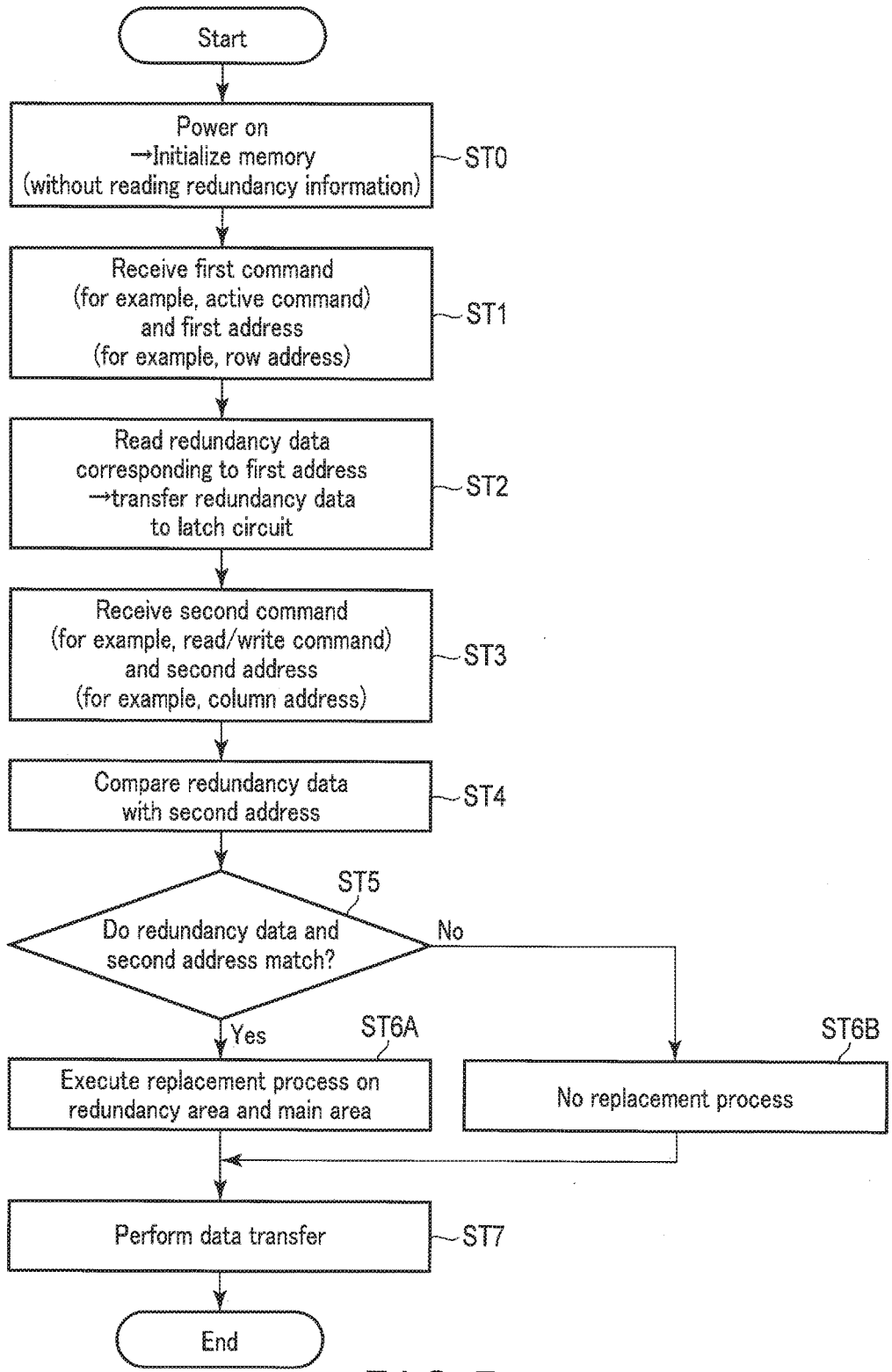
FIG. 7 is a flowchart illustrating an operation example of the memory device in the first embodiment.

FIG. 7 is a flowchart illustrating the operation example of the resistance change type memory in the present embodiment. FIG. 8 is a timing chart illustrating the operation example of the resistance change type memory in the present embodiment. FIG. 9 is a schematic diagram illustrating the operation example of the resistance change type memory in the present embodiment.

Figure 8:
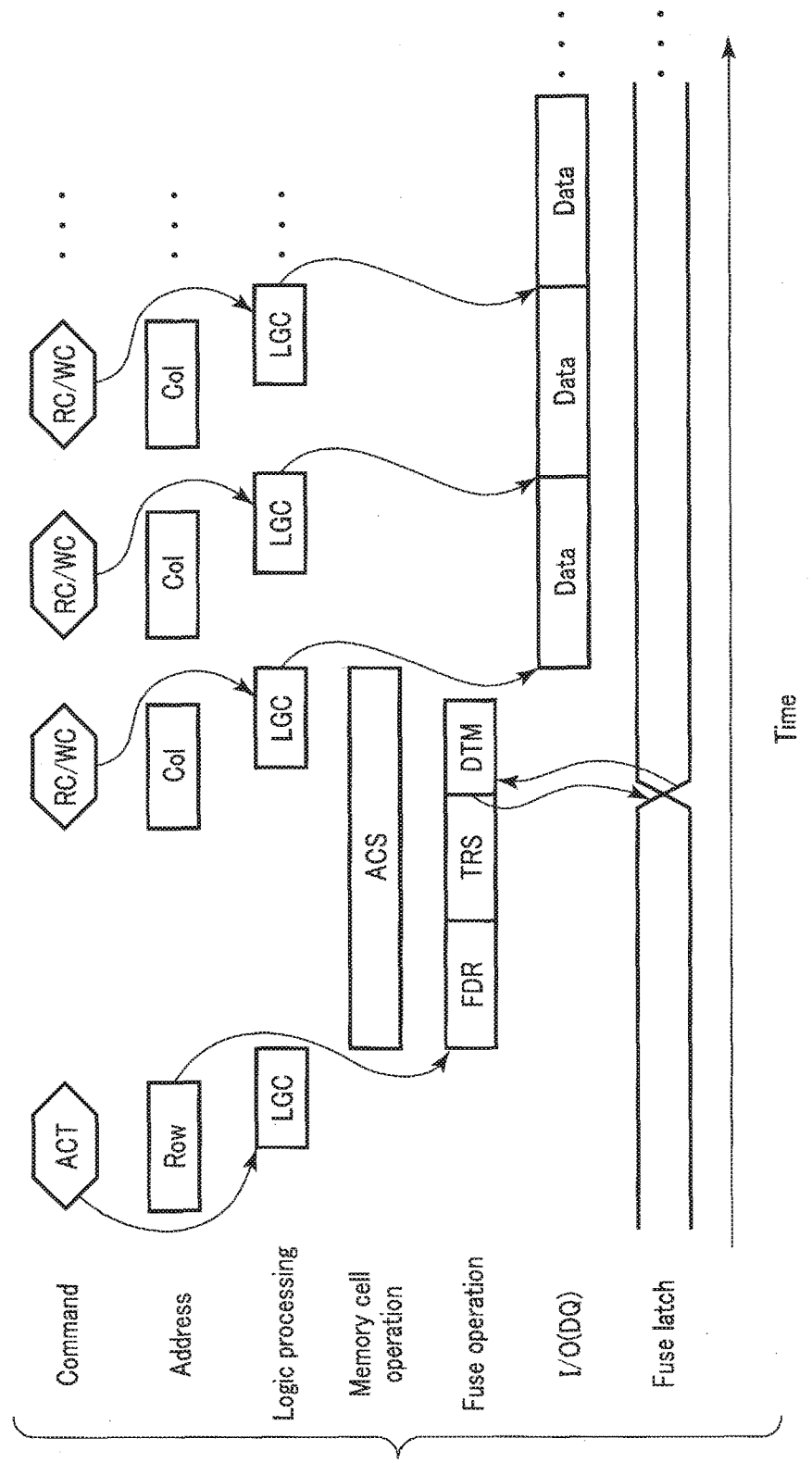
FIG. 8 is a timing chart illustrating the operation example of the memory device in the first embodiment.

As depicted in FIG. 7 and FIG. 8, when powered on, the resistance change type memory (for example, MRAM) 1 in the present embodiment performs an initial setting operation based on setting information from the host device 999 and the controller 9, precharging of the interconnects (for example, the bit lines) inside the memory 1, and the like without reading the redundancy data in the fuse box 141 (ST0).

In accordance with a request from the host device 999 for data reading or data writing, the memory controller 9 transmits an active command CMD-ACT and an address ADR to the memory 1 via the CA pad 81.

In the present embodiment, the address transmitted along with the active command CMD-ACT is a row address ADR-Row.

The memory 1 substantially simultaneously receives the active command CMD-ACT and the row address ADR-Row (step ST1). The command CMD-ACT and the address ADR-Row are input to the command/address latch circuit 17. The command/address latch circuit 17 transfers the command CMD-ACT to the sequencer 19.

The sequencer 19 executes logic processing LGC on the command CMD-ACT. Thus, the sequencer 19 recognizes that the command CMD-ACT is an active command and performs control on each circuit base on the command CMD-ACT.

The row address ADR-Row is transferred from the command/address latch circuit 17 to the row control circuit (row decoder) 13. The row control circuit (row decoder) 13 decodes the row address ADR-Row. Thus, the row address to be accessed (selected row address, page) is determined. The sequencer 19 performs control based on the command CMD-ACT to activate the word line WL corresponding to the selected page.

When the selected word line is activated, the memory cell MC and redundancy cell RDC connected to the selected word line are set to an on state and the cells MC, RDC become accessible.

Continuously with or in parallel with the input of the active command to a certain bank, the active command CMD-ACT and the address ADR-Row for another bank may be received by the memory 1.

The sequencer 19 executes access processing ACS on the memory cell array 10 based on the row address ADR-Row. Thus, the input and output of data to and from the memory cell array 10 are enabled.

In parallel with internal processing on the memory cell array 10 based on the command CMD-ACT, the memory 1 performs a fuse operation for a replacement process (step ST2).

The row address ADR-Row is supplied to the fuse circuit 14.

The fuse control circuit 142 decodes the row address ADR-Row. Based on the decoded row address ADR-Row, the fuse control circuit 142 performs a reading operation FDR of the redundancy data FD in the fuse box 141.

Figure 9:
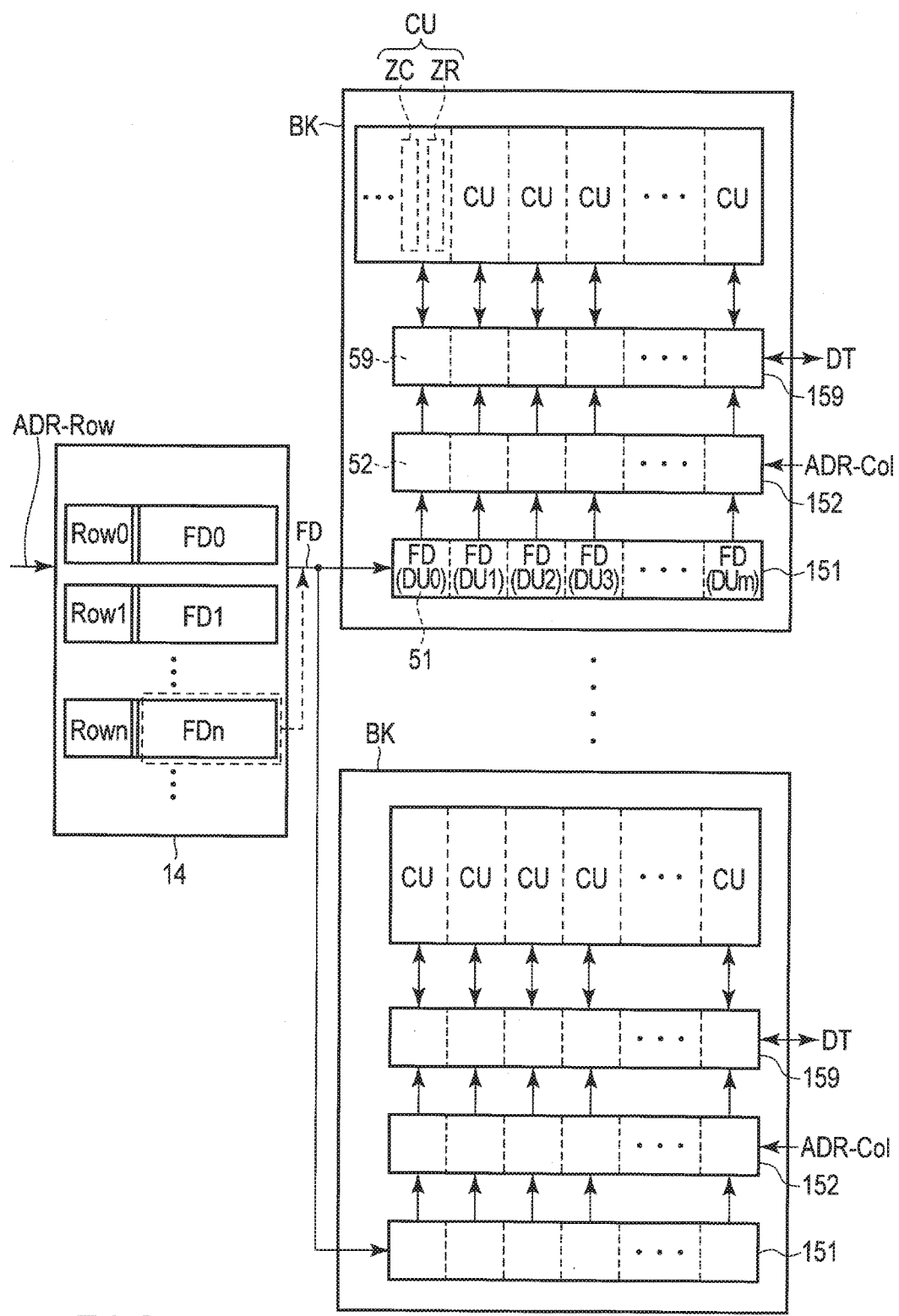
FIG. 9 is a schematic diagram illustrating the operation example of the memory device in the first embodiment.

As depicted in FIG. 9, the column redundancy data of the redundancy data FD associated with the respective row access units in the fuse box 141 which corresponds to the selected row address ADR-Row is read from the fuse box 141 (step ST2).

For example, the fuse control circuit 142 references a part of the selected row address ADR-Row which is indicative of the control unit in the row (for example, an address indicative of a segment or the address of the selected word line) to selectively read the redundancy data in the fuse box 141.

The fuse control circuit 142 performs a transfer operation TRS of the redundancy data to the redundancy control circuit 15.

For example, reading and transfer of data from the fuse box 141 based on the selected row address may be performed on a plurality of banks in parallel. The same redundancy data FD may be transferred to the plurality of banks. Furthermore, different data for the respective banks may be transferred to respective banks at respective timings.

The fuse latch circuit 151 retrieves the redundancy data FD.

Each redundancy data FD is held by the latch unit corresponding to the column access unit. Each latch unit 51 holds a part (data unit) of the redundancy data FD which corresponds to the column access unit CU corresponding to the latch unit. Each latch unit 51 holds data units DU (DU0 to DUm) including different defect column addresses. m is a natural umber of at least 1.

The replacement determination circuit 152 prepares for the determination process for the replacement between the defective column and the redundancy column.

After a certain period has elapsed since the transmission of the active command CMD-ACT, the memory controller 9 transmits a read command RC (or write command) and a column address (selected column address) ADR-Col to the memory 1.

The memory 1 receives the read command RC and the column address ADR-Col (step ST3).

The sequencer 19 executes logic processing LGC on the command CMD-RC. The sequencer 19 thus recognizes that the command CMD-RC is a read command and executes controls of the circuits for data reading.

The column address ADR-Col is transferred to the column control circuit 12 (column decoder 120). The column decoder 120 decodes the column address ADR-Col. Thus, the bit line and circuits indicated by the decoded selected column address are activated.

The decoded selected column address ADR-Col is transferred to the replacement determination circuit 152.

The replacement determination circuit 152 compares the column address ADR-Col with the redundancy data FD in the fuse latch circuit 151 (step ST4). The replacement determination circuit 152 determines whether the selected column address ADR-Col matches the column redundancy data corresponding to the selected row address ADR-Row (step ST5).

Each of the determination units 52 executes a determination process (logic processing) DTM on the column address ADR-Col provided by the memory controller 9 and the redundancy data FD in the corresponding latch unit 51.

Each determination unit 52 outputs the control signal dRD based on the comparison result for the column address ADR-Col and the redundancy data to the redundancy switch circuit 159.

When, in a certain arithmetic circuit 521 in the determination unit 52 corresponding to the access target main column, the selected column address ADR-Col matches the redundancy data FD in the latch unit 51, the arithmetic circuit 521 outputs the control signal dRD at the first level (for example, the H level) to the switch 591 corresponding to the arithmetic circuit 521.

For example, the arithmetic circuit 521 executes the logic processing on that part of the column address ADR-Col and that part of the redundancy data to which the arithmetic circuit 521 corresponds.

Based on the first signal level, the switch 591 connects the redundancy data line RL to the internal data line IL.

Thus, the redundancy column ZR in the redundancy area 109 is connected to the I/O circuit 16.

The main column (defective column) in the main area 101 corresponding to the switch 591 to which the first signal level (H level) has been supplied is electrically separated from the I/O circuit 16 by the switch unit 59.

The defective main column ZC is replaced with the redundancy column ZR in the redundancy area 109 (step ST6A).

When the arithmetic circuit 521 determines that the column address ADR-Col does not match the redundancy data FD, the arithmetic circuit 521 outputs the control signal dRD at the second level (for example, the L level) different from the first level, to the switch 591.

When the control signal dRD at the second signal level (L) is supplied to the switch 591, the switch 591 connects the main data line ML to the internal data line IL. Thus, the main column ZC in the main area 101 is connected to the I/O circuit 16.

When the access target main column ZC indicated by the selected address is thus determined not to be a defective column (determined to be normal), the replacement process is not executed (step ST6B).

As described above, when the defective column is present in the column access unit CU, a part of the column access unit CU which contains the defect is replaced with the redundancy column.

After such a replacement process (switching of the connection between the data line and the I/O circuit), transfer of data to the column access unit (memory cell array) is performed (step ST7).

When the command CMD is a read command, the data only from the main area 101 or the data from the main area 101 and the redundancy area 109 is transferred to the memory controller 9 via the I/O circuit 16 depending on whether or not the column address and the redundancy data match.

When the command CMD is the write command RC, external data is transferred from the I/O circuit 16 only to the main area 101 or to the main area 101 and the redundancy area 109 depending on whether or not the column address and the redundancy data match.

With respect to one active command CMD-ACT and one row address ADR-Row, a plurality of read/write commands and a plurality of column addresses ADR-Col are sequentially supplied. Thus, one page of data is transferred.

The above-described operation completes the data transfer between the resistance change type memory and the memory controller.

In the controlling method of the resistance change type memory in the present embodiment, when the command and the row address are received, one piece of the redundancy data corresponding to the row address among the plurality of redundancy data in the fuse box is selectively transferred to the latch circuit in the redundancy control circuit as described above. Then, the determination process and the replacement process for the defective column in the memory cell array are executed using the redundancy data corresponding to the selected row address and the selected column address.

(c) Summary

For memory devices such as resistance change type memories, miniaturization of elements (memory cells) and an increase in storage density have been promoted. To achieve a high yield of memory devices, relief of defects using the redundancy function has been applied to the memory devices.

However, with increased storage density and miniaturized memory cells, the percent defective in the memory device tends to increase. Thus, the scale of the circuit for the redundancy function increases, and thus, the rate of the circuit for the redundancy function in the memory device (chip) may be non-negligible.

Moreover, if the memory device, when powered on in the memory device, transfers the redundancy data stored in the fuse circuit to the redundancy control circuit, the latch circuit in the redundancy control circuit stores all of the redundancy data in the fuse circuit and executes the replacement process. In this case, the redundancy control circuit includes the latch circuit with a large storage capacity, and the scale (area in the memory chip) of the latch circuit may increase.

Moreover, when the number of redundancy elements increases in order to improve the relief rate for defective cells, the storage capacity of the fuse circuit tends to increase. Hence, in the memory device, the scale of the latch circuit in the redundancy control circuit tends to increase consistently with an improvement of the relief rate for defective cells.

Based on the address (for example, the row address) supplied along with the command, the resistance change type memory in the present embodiment reads the redundancy data corresponding to the supplied address from the plurality of redundancy data (data on defective column addresses) in the fuse circuit.

The read redundancy data is held by the fuse latch circuit in the redundancy control circuit.

The resistance change type memory in the present embodiment compares the redundancy data read based on the selected row address with the selected column address supplied after the supply of the selected row address.

Based on the comparison result for the redundancy data and the column address, the resistance change type memory in the present embodiment determines whether or not to execute the replacement process using the redundancy column (whether or not to access the redundancy column).

When reading of the redundancy data from the se circuit is performed at the timing when the access to the memory cell array is started as in the present embodiment, the redundancy data corresponding to the access target control unit (row) can be exclusively transferred to the fuse latch circuit.

Thus, the resistance change type memory in the present embodiment enables a reduction in the size of the redundancy data (defect address) held by the fuse latch circuit 151 during the replacement process. Therefore, the resistance change type memory in the present embodiment enables a reduction in the circuit scale of the fuse latch circuit 151.

For example, in DRAMs, there is a short period from reception of the row address (active command) until reception of the column address (read/write command) in order to achieve high-speed access based on the specification for the DRAM. Thus, the DRAM has difficulty securing an amount of time to read and transfer the redundancy data in the fuse circuit during the period from reception of the row address until reception of the column address.

The resistance change type memory tends to have a smaller page size than DRAMs. For example, MRAMs tend to have a larger sense amplifier size than the DRAMs. Consequently, for a certain area (chip size), the number of bit lines tends to be small, and moreover, the page size tends to be small. Thus, the resistance change type memory has more row addresses than the DRAMs in order to meet the storage capacity based on the memory specification. An increased number of row addresses leads to a reduced number of column addresses. The resistance change type memory thus has a reduced amount of information for column redundancy.

The structure of the memory cell in the resistance change type memory (for example, an MRAM) is different from the structure of the memory cell in the DRAM. Furthermore, the read mechanism (configuration and control of the circuit) of the resistance change type memory is different from the read mechanism of the DRAM. Such differences between the resistance change type memory and the DRAM may cause an increase in the control time for the rows in the memory cell array in the resistance change type memory.

Hence, the resistance change type memory in the present embodiment allows an amount of time to transfer the fuse data (redundancy data) to the redundancy control circuit to be secured during the period from reception of the row address and reception of the column address.

As a result, the resistance change memory in the present embodiment allows transfer of the redundancy data from the fuse circuit to the redundancy control circuit (fuse latch circuit) to be performed during the control for the rows in the memory cell array.

The resistance change type memory in the present embodiment enables a reduction in the number of latch circuits to hold the redundancy information.

As a result, the memory device in the present embodiment enables a high yield to be achieved and allows an increase in chip size to be suppressed.

(2) Second Embodiment

A memory device and a controlling method thereof will be described with reference to FIG. 10 and FIG. 11.

A resistance change type memory as the memory device in the present embodiment is different from the resistance change type memory in the first embodiment in that both a row address and a column address are used to selectively read redundancy data corresponding to the row and column addresses from the fuse circuit during a period of access to the memory cell array.

Figure 10:
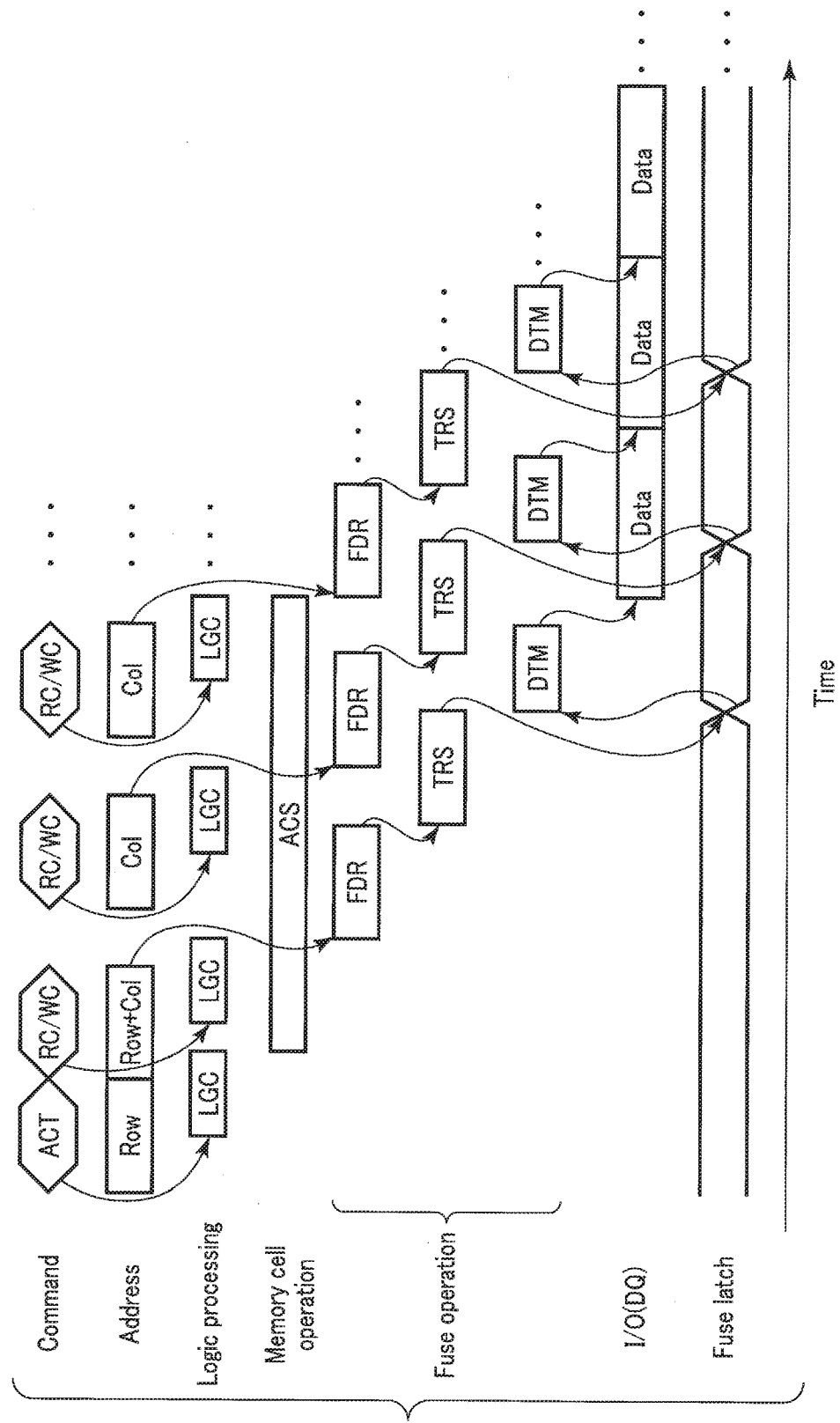
FIG. 10 is a timing chart illustrating an operation example of a memory device in a second embodiment.

FIG. 10 is a timing chart illustrating an operation example of the resistance change type memory in the present embodiment. FIG. 11 is a schematic diagram illustrating the operation example of the resistance change type memory in the present embodiment. An internal configuration of the resistance change type memory in the present embodiment is substantially the same as the internal configuration of the resistance change type memory in the first embodiment, and thus, the specific description of the internal configuration of the memory is omitted.

Operation modes (access modes) of the resistance change type memory include a mode in which a row address and a column address are issued at substantially the same time.

As described above, the resistance change type memory 1 tends to have a larger row address than DRAMs. As a result, many bits are used to indicate the row address. Furthermore, the number of pads used to transmit and receive commands and addresses may be defined based on the specification or standard for the memory. Thus, when a command and an address are transmitted from the memory controller 9 to the memory 1 at the same time, not all the bits indicative of a selected row address may be transmitted or received at a time. In this case, the memory controller 9 transmits the row address to the resistance change type memory 1 in a plurality of divided pieces.

Furthermore, the resistance change type memory 1 and the memory controller have larger row address than DRAMs due to the storage capacity based on the specification/standard for the memory, while having a smaller column address than the DRAMs. Hence, the resistance change type memory and the memory controller use a number of pads based on the specification for the memory to allow a part of the row address to be transmitted simultaneously with the column address.

Based on such an operation mode and a specification, the resistance change type memory in the present embodiment operates as follows.

As depicted in FIG. 10, in the present embodiment, two different commands CMD are consecutively transmitted and received.

Of the two consecutive commands, one command CMD is an active command CMD-ACT. The other command is a read command CMD-RC or a write command CMD-WC. In the present embodiment, the consecutive commands indicate that, during logic processing executed on one command (the active command in the present example), the other command (the read/write command in the present example) is transmitted and received.

The memory 1 receives the active command CMD-ACT and also receives a part ADR-R1 of a selected row address ADR-Row.

The memory 1 receives the read command CMD-RC (or the write command CMD-WC) and also receives the remaining part ADR-R2 of the selected row address ADR-Row and the selected column address ADR-Col. The read command CMD-RC and the addresses ADR-R2, ADR-Col are received during the logic processing LGC executed on the active command CMD-ACT.

The selected row and column addresses ADR-Row, ADR-Col are transferred to a fuse control circuit 142.

The fuse control circuit 142 performs a read operation FDR on redundancy data FD based on the selected addresses ADR-Row, ADR-Col (all or a part of the address).

As described above, the redundancy data FD corresponding to a row access unit includes a plurality of data units DU corresponding to column access units.

Figure 11:
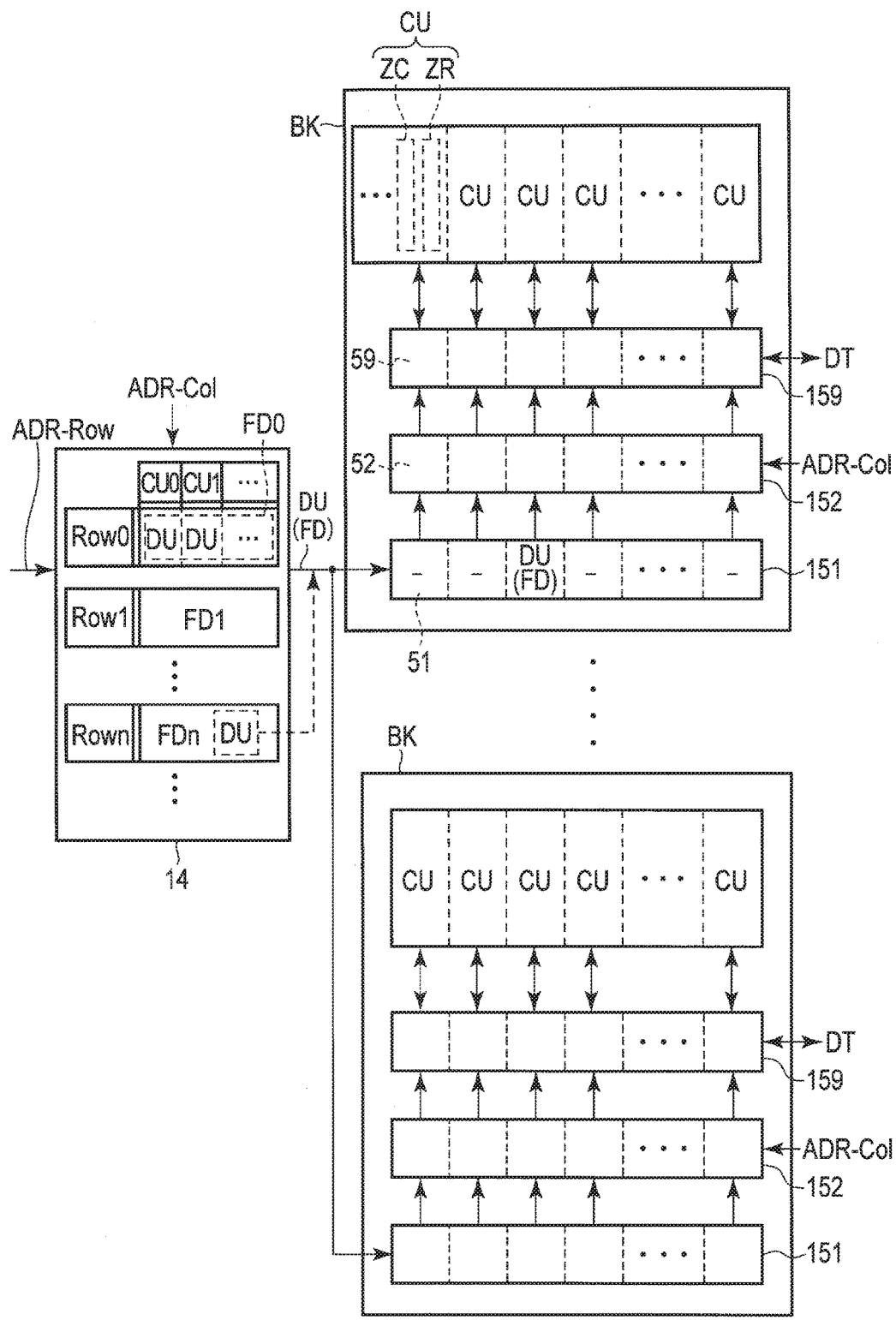
FIG. 11 is a schematic diagram illustrating the operation example of the memory device in the second embodiment.

As depicted in FIG. 11, one data unit DU of the plurality of data units DU in the selected redundancy data FD is selected based on the selected column address ADR-Col.

Thus, the redundancy data (data units in the redundancy data) corresponding to both the selected row address ADR-Row and the selected column address ADR-Col are read from a fuse box 141.

The fuse control circuit 142 performs a transfer operation TRS to transfer the read redundancy data FD to a fuse latch circuit 151 in a redundancy control circuit 15.

As depicted in FIG. 11, in the present embodiment, the redundancy data FD is transferred only to a latch unit 51 for the column access unit corresponding to the selected column address.

A determination unit 52 compares the redundancy data (data unit) in the latch unit 51 with the selected column address ADR-Col to determine whether or not to execute a replacement process using a redundancy column ZR.

Latch units determination units holding no redundancy data correspond to unselected column access units. Hence, a replacement switch is controlled so as to allow data for a main area 101 to be transferred to the latch units/determination units holding no redundancy data.

Subsequently, the resistance change type memory in the present embodiment performs transfer of data between a memory cell array 10 and an I/O circuit 16 based on the result of a determination process as is the case with the first embodiment.

As described above, even when the resistance change type memory consecutively receives the command/address, the redundancy data for the replacement process can be transferred from a fuse circuit 14 to the latch circuit 151 during the period of access to the memory cell array 10 (before data transfer to the memory cell array).

Therefore, the memory device in the second embodiment produces effects similar to the effects of the first embodiment.

(3) Third Embodiment

A memory device in a third embodiment will be described with reference to FIGS. 12 to 14.

Figure 12:
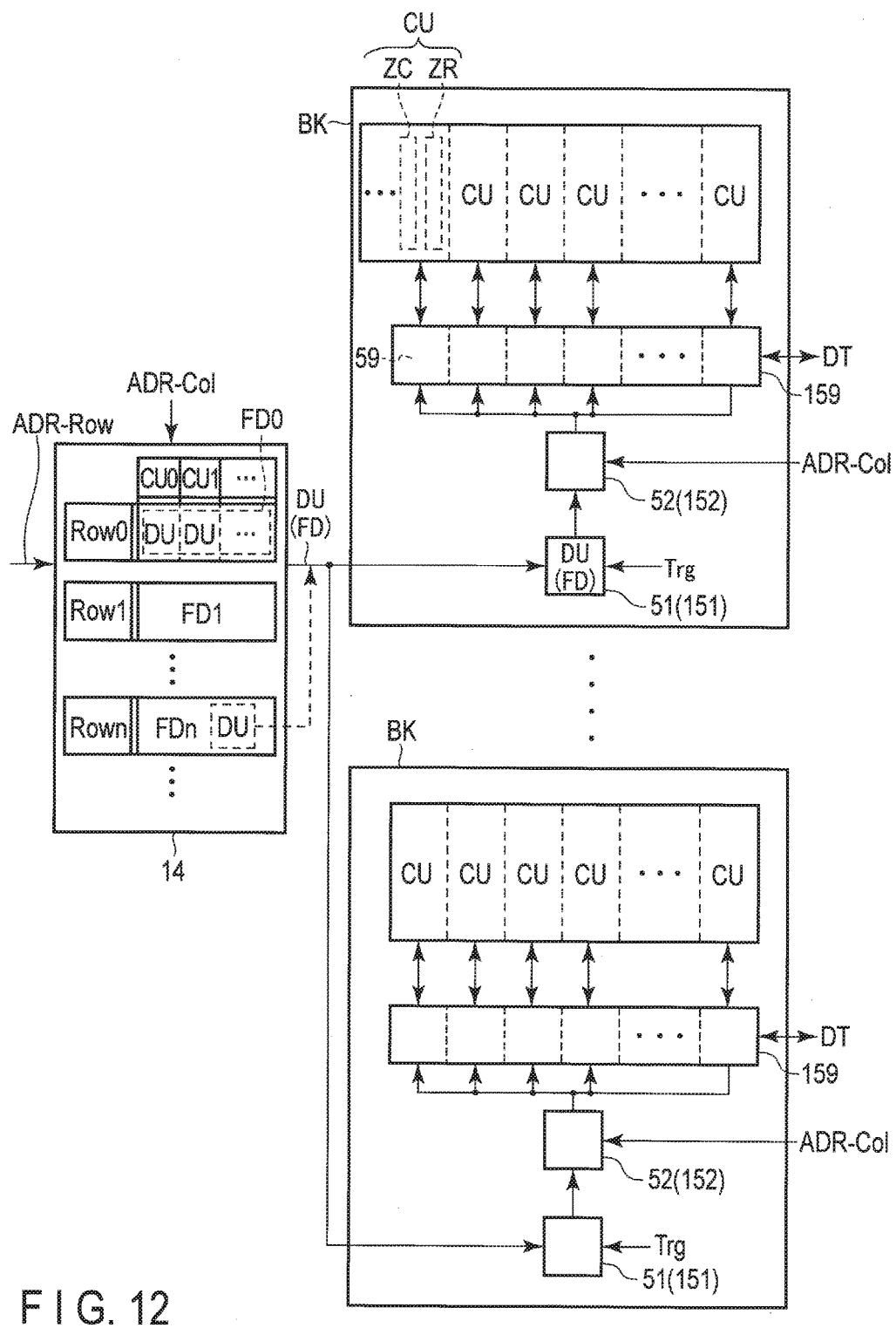
FIG. 12 is a schematic diagram illustrating an operation example of a memory device in a third embodiment.

FIG. 12 is a diagram schematically depicting an internal configuration and an operation example of a resistance change type memory as the memory device in the present embodiment. FIG. 13 is a timing chart illustrating the operation example of the resistance change type memory in the present embodiment.

As depicted in FIG. 12, when redundancy data in a fuse latch circuit is read using both a selected row address and a selected column address as is the case with the resistance change type memory in the second embodiment, a fuse latch circuit may be able to hold addresses (fuse data) for one column access unit.

In the resistance change type memory 1 in the present embodiment, a latch circuit 151X in a redundancy control circuit has a storage capacity that enables holding of data (redundancy data) with a bit length indicating one column access unit. For example, the fuse latch circuit 151X includes one latch unit 51 that can hold addresses for one column access unit.

A control signal Trg is supplied to the latch unit (fuse latch circuit 151X).

As described above, the resistance change type memory in the present embodiment uses the selected row address and the selected column address to read the fuse data (a defect address in the selected column access unit), enabling a further reduction in the circuit scale of the latch circuit temporarily holding the redundancy data.

When one latch unit 51 is provided, one determination unit 52 may be provided in a replacement determination circuit 152.

For example, when the redundancy data FD is held by the latch unit 51 corresponding to one column access unit as depicted in FIG. 13, a retrieval timing for the redundancy data FD in the fuse latch circuit 151X is controlled by a control signal (hereinafter referred to as a latch trigger signal) Trg.

For example, the latch unit 51 retrieves the redundancy data FD in synchronism with a timing when the latch trigger signal Trg shifts from L level to H level.

During a period T1 from the beginning of retrieval the redundancy data FD in a certain cycle until the latch trigger signal Trg in the next cycle shifts from L level to H level, the data in the latch unit 51 is in a valid state.

Transfer of data between the column access unit (main column/redundancy column) CU and an I/O circuit 16 is performed during a period while the redundancy data FD used for replacement determination for transfer of the data is in the valid state.

As described above, for the replacement process for certain redundancy data, the period of the data transfer in the memory cell array does not exceed the period while the redundancy data is valid.

For example, the determination process for the redundancy data FD and the selected column address is executed during a period while the latch trigger signal Trg is at the H level.

Thus, the resistance change type memory in the present embodiment can prevent the redundancy data in the latch unit 51 from being rewritten during the determination process.

FIG. 14 is a schematic diagram depicting a modification of the resistance change type memory in the present embodiment.

When one latch unit 51 and one determination unit 52 are provided, one switch unit 59 may be provided in a switch circuit 159 as depicted in FIG. 14.

Even when, like the latch unit 51 and the determination unit 52, one switch unit 59 is provided, the resistance change type memory 1 allows determination of redundancy and control of connection to a redundancy area to be achieved by an operation illustrated in FIG. 13.

Therefore, the memory device in the third embodiment can produce effects similar to the effects of the first and second embodiments.

(4) Modification

A modification of the memory device (for example, the resistance change type memory) in the embodiments will be described with reference to FIG. 15 and FIG. 16.

Figure 15:
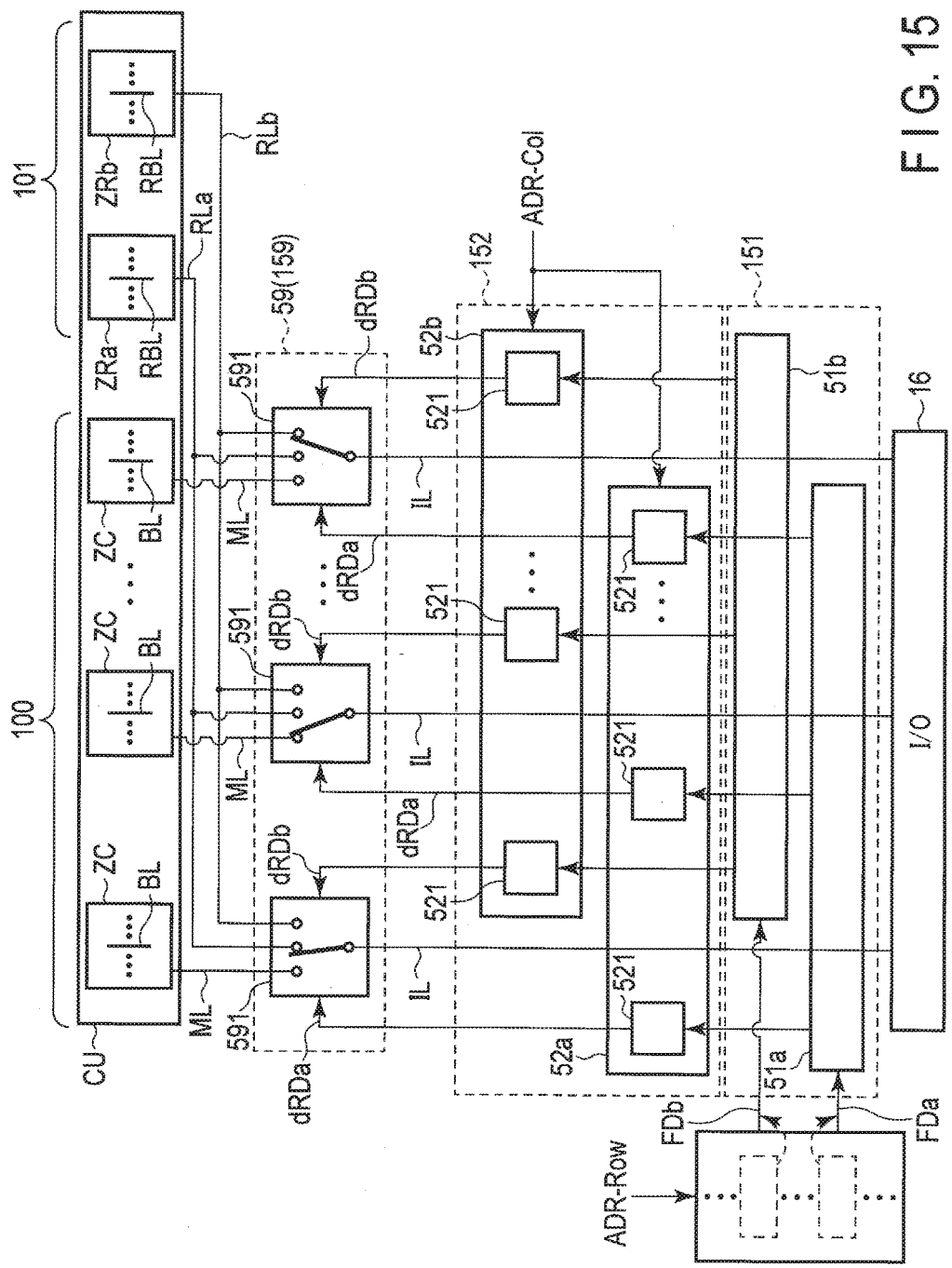
FIG. 15 is a diagram illustrating a modification of the memory device in the embodiments.

FIG. 15 is a schematic diagram illustrating the modification of the resistance chance type memory in the embodiments.

For example, to relieve a plurality of defects that fail to be relieved using one relief unit, a plurality of redundancy columns ZR may be provided in one column access unit CU, as depicted in FIG. 15.

In this case, the fuse latch circuit 151 includes a plurality of latch units 51 (51a, 51b) for one column access unit CU.

Each latch unit 51 holds a plurality of different redundancy data FDa, FDb (data unit flu) in the column access unit. The different redundancy data FDa, FDb indicate different defect addresses in the column access unit CU. However, the two pieces of redundancy data FDa, FDb are column redundancy data FDa, FDb corresponding to the common selected row address ADR-Row.

When two redundancy columns (relief units) are provided for one column access unit CU, two latch units 51 are provided in association with the one column access unit.

The latch unit 51 may hold the redundancy data (data unit DU) selectively read based on the selected row and column address ADR-Row, ADR-Col.

The replacement determination circuit 152 includes a plurality of determination units 52 (52a, 52b) for one column access unit CU. Single determination unit 52 (52a, 52b) corresponds to single latch unit 51 (51a, 51b).

Single determination unit 52 compares one piece of the redundancy data FD with the selected column address ADR-Col. For example, each the one determination unit 52a compares the one piece of the redundancy data FDa with the selected column address ADR-Col for a target relief unit. Each the other determination unit 52b compares the other piece of the redundancy data FDb with the selected column address ADR-Col for a target relief unit.

The replacement switch circuit 159 includes a plurality of switches 591 in the switch unit 59.

One switch 591 is connected to a plurality of determination units 52a, 52b that execute logic processing LGC on different redundancy data (a part of the data).

One switch 591 is supplied with a plurality of determination results.

Based on control signals dRDa, dRDb from the determination units 52a, 52b, the switch 591 connects the I/O circuit 16 to one of the main column ZC and the redundancy column ZR.

Based on the two different control signals (determination results for the address), the switch 591 connects one of the main data line ML and redundancy data lines RLa, RLb to the I/O circuit 16.

For example, when the signal level of the control signal dRDa is the H level and the signal level of the control signal dRDb is the L level, the switch 591 connects the redundancy data line RLa (redundancy column ZRa) included in the two redundancy data lines RLa, RLb to the I/O circuit 16. When the signal level of the control signal dRDa is the L level and the signal level of the control signal dRDb is the H level, the switch 591 connects the redundancy data line RLb (redundancy column ZRb) to the I/O circuit 16.

When both the control signals dRDa, dRDb are at the L level, the switch 591 connects the main data line ML (main column ZC) to the I/O circuit 16. The replacement determination circuit 152 is designed to prevent both the control signals dRDa, dRDb from being set at the H level.

As described above, the resistance change type memory in the present modification allows execution of the process of replacing a plurality of defective columns in one column access unit with redundancy columns.

At least three defects in the column access unit CU can be relieved based on at least three redundancy data.

The resistance change type memory in the modification depicted in FIG. 15 enables an increase in the relief rate for defects in the column access unit.

Figure 16:
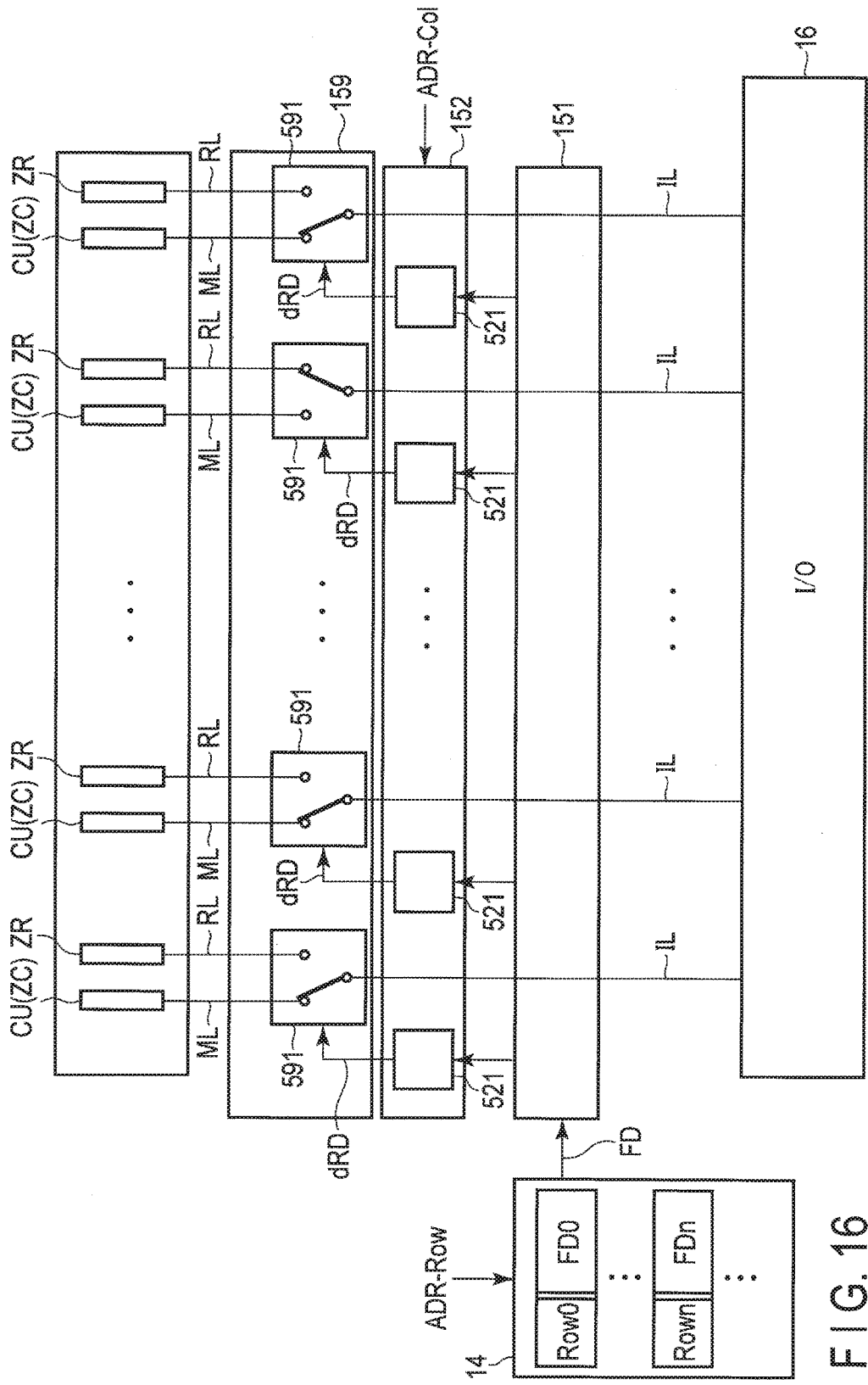
FIG. 16 is a diagram illustrating the modification of the memory device in the embodiments.

FIG. 16 is a schematic diagram illustrating the modification of the resistance change type memories in the embodiments.

As depicted in FIG. 16, for example, the column access unit CU may be treated as a relief unit.

In this case, the column access unit CU including a defective column is replaced with the redundancy column ZR having the same storage capacity as that of one column access unit CU.

The replacement switch circuit 159 has a plurality of switches 591.

One switch 591 corresponds to a set of one column access unit CU and one redundancy column ZR.

Furthermore, the replacement determination circuit 152 has a plurality of arithmetic circuits 521. One arithmetic circuit 521 corresponds to one switch 591.

The fuse latch circuit 151 holds the redundancy data FD selectively read based on the selected row address ADR-Row as is the case with the first embodiment. The fuse latch circuit 151 may hold the redundancy data FD selectively read based on the selected row and column addresses ADR-Row, ADR-Col.

Based on the determination result (comparison result for the selected column address and the redundancy data) for the replacement process executed by the arithmetic circuit 521, each switch 591 connects one of the column access unit CU and the redundancy column ZR to the I/O circuit 16.

When the selected column address ADR-Col is a defect address indicated by the fuse data FD, the whole column access unit CU corresponding to the selected column address ADR-Col is replaced with the redundancy column ZR.

As described above, the resistance change type memory in the present modification can execute the process of replacing the entirety of one column access unit with the redundancy column ZR.

The resistance change type memory depicted in FIG. 16 allows relief of defects in the memory cell array to which the column redundancy mechanism is applied, using a relatively simple circuit configuration and control.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory device comprising:
    a memory cell array including a first array and a second array, the first array including a plurality of first memory cells, the second array including at least one second memory cell, the plurality of first memory cells being respectively connected to a plurality of first lines, and the at least one second memory cell being connected to at least one second line;
    an input/output circuit configured to receive first data from the memory cell array and send second data to the memory cell array, the input/output circuit being connected to a plurality of third lines;
    a fuse circuit configured to hold at least one piece of third data, the third data indicating a defect address corresponding to one of the plurality of first memory cells included in the first array which has been determined to be defective; and
    a control circuit including a switch circuit, the switch circuit including a plurality of switch elements, each of the plurality of switch elements being configured to electrically connect a corresponding one of the third lines with a corresponding one of the first lines or with the second line, and the control circuit being configured to control connection destinations of the respective switch elements of the switch circuit based on the third data,
    wherein:
    upon receipt of a first address in a first direction in the first array, the fuse circuit transfers the third data corresponding to the first address to the control circuit, and
    upon receipt of a second address in a second direction in the first array after the third data is transferred to the control circuit, the control circuit accesses first memory cells other than the one of the plurality of first memory cells corresponding to the third data and the second memory cell via the switch circuit based on a comparison result for the second address and the third data.

2. The memory device according to claim 1, wherein the control circuit accesses the second array via the switch circuit when the defect address matches the second address.

3. The memory device according to claim 1, wherein the control circuit accesses a part in the first array which is indicated by the first and second address via the switch circuit when the defect address does not match the second address.

4. The memory device according to claim 1, wherein
    the first address is supplied with a first command, and
    the first command is a signal that allows activation of a first unit set for the first direction in the memory cell array.

5. The memory device according to claim 1, wherein
    the second address is supplied with a second command, and
    the second command is a signal that allows execution of reading of the first data from the memory cell array or writing of the second data to the memory cell array.

6. The memory device according to claim 1, wherein
    the fuse circuit includes a fuse array that stores the at least one piece of third data,
    the control circuit includes a latch circuit that holds the third data transferred from the fuse array, and
    a storage capacity of the latch circuit is smaller than a storage capacity of the fuse array.

7. The memory device according to claim 1, wherein:
the first array includes:
   a first number of first control units set for the first direction; and
   a second number of second control units set for the second direction,
the second array is located adjacent to the first array in the second direction,
the control circuit includes a latch circuit that holds the third data, and
the latch circuit includes the second number of first latch units.

8. The memory device according to claim 1, wherein
the first address is a row address in the memory cell array, and
the second address is a column address in the memory cell array.

9. The memory device according to claim 1, wherein
each of the plurality of first memory cells and the second memory cell includes a memory element selected from the group consisting of a magnetoresistive element, a metal oxide type variable resistance element, and a phase change element.

10. A memory device comprising:
a memory cell array with a first array and a second array, the first array including a plurality of first memory cells, the second array including at least one second memory cell, the plurality of first memory cells being respectively connected to a plurality of first lines, and the at least one second memory cell being connected to at least one second line;
an input/output circuit configured to receive first data from the memory cell array and send second data to the memory cell array, the input/output circuit being connected to a plurality of third lines;
a fuse circuit configured to hold at least one piece of third data, the third data indicating a defect address corresponding to one of the plurality of first memory cells included in the first array which has been determined to be defective;
a latch circuit configured to hold the third data transferred from the fuse circuit; and
a control circuit including a switch circuit, the switch circuit including a plurality of switch elements, each of the plurality of switch elements being configured to electrically connect a corresponding one of the third lines with a corresponding one of the first lines or with the second line, and the control circuit being configured to control connection destinations of the respective switch elements of the switch circuit using the third data in the latch circuit,
wherein:
a storage capacity of the latch circuit is smaller than a storage capacity of the fuse circuit.

11. The memory device according to claim 10, wherein:
upon receipt of a first address in a first direction in the first array, the fuse circuit transfers the third data corresponding to the first address to the latch circuit,
upon receipt of a second address in a second direction in the first array after the third data is transferred, the control circuit accesses first memory cells other than the one of the plurality of first memory cells corresponding to the third data and the second memory cell via the switch circuit based on a comparison result for the second address and the third data.

12. The memory device according to claim 10, wherein:
the control circuit selects one piece of third data based on a first address in a first direction in the first array, and selects one data unit among a plurality of data units in the selected one piece of third data based on a second address in a second direction in the first array,
the control circuit transfers the selected data unit to the latch circuit, and
the control circuit accesses one of the first and second arrays via the switch circuit based on the comparison result for the second address and the selected data unit.

13. The memory device according to claim 10, wherein:
the first array includes:
   a first number of first control units set for a first direction of the first array; and
   a second number of second control units set for a second direction of the first array,
the second array is located adjacent to the first array in the second direction, and
the latch circuit includes a latch unit corresponding to one of the second control units.

14. The memory device according to claim 10, wherein
a first address in a first direction in the first array is supplied with a first command,
a second address in a second direction in the first array is supplied with a second command following the first command,
the first command is a signal that allows activation of a first control unit set for the first direction in the memory cell array, and
the second command is a signal that allows execution of reading of the first data from the memory cell array or writing of the second data to the memory cell array.

15. The memory device according to claim 14, wherein
the first address is a row address in the memory cell array, and
the second address is a column address in the memory cell array.

16. A method of controlling a memory device, the method comprising:
receiving a first address in a first direction in a first array of a memory cell array, the memory cell array including the first array and a second array, the first array including a plurality of first memory cells, the second array including at least one second memory cell, the plurality of first memory cells being respectively connected to a plurality of first lines, and the at least one second memory cell being connected to at least one second line;
transferring at least one piece of first data which corresponds to the first address from a fuse circuit to a latch circuit, the first data including a defect address corresponding to one of the plurality of first memory cells included in the first array which has been determined to be defective;
receiving a second address in a second direction in the first array;
controlling connection destinations of a plurality of switch elements of a switch circuit based on a comparison result for the defect address in the first data and the second address, each of the plurality of switch elements being configured to electrically connect a corresponding one of a plurality of third lines with a corresponding one of the first lines or with the second line, the plurality of third lines being connected to a input/output circuit;

accessing first memory cells other than the one of the plurality of first memory cells corresponding to the first data and the second memory cell via the switch circuit based on the comparison result; and transferring second data between the input/output circuit and the first and second arrays via the switch circuit.

17. The method of controlling the memory device according to claim 16, wherein:

the first address is received with a first command that allows activation of a first control unit for the memory cell array, and the second address is received with a second command that allows execution of reading of the second data from the memory cell array or writing of the second data to the memory cell array.

18. The method of controlling the memory device according to claim 17, wherein the first data is transferred during processing in accordance with the first command.

19. The method of controlling the memory device according to claim 16, further comprising:

powering the memory device on before receiving the first address.

20. The method of controlling the memory device according to claim 16, wherein the first address is a row address in the memory cell array, and the second address is a column address in the memory cell array.

* * * * *